(12) United States Patent
Drexler et al.

(10) Patent No.: US 6,687,180 B2
(45) Date of Patent: Feb. 3, 2004

(54) DRIVER CONTROL CIRCUIT

(75) Inventors: Adrian J. Drexler, Meridian, ID (US); Debra M. Bell, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 10/132,032

(22) Filed: Apr. 25, 2002

(65) Prior Publication Data

US 2003/0202415 A1 Oct. 30, 2003

(51) Int. Cl.$^7$ ................................................ G11C 8/00
(52) U.S. Cl. .......................... 365/230.03; 365/230.06; 365/189.05
(58) Field of Search ...................... 365/230.03, 230.06, 365/189.05, 230.08, 189.01

(56) References Cited

U.S. PATENT DOCUMENTS

| | | | | |
|---|---|---|---|---|
| 5,402,378 A | * | 3/1995 | Min et al. | 365/202 |
| 5,848,023 A | * | 12/1998 | Kato et al. | 365/230.09 |
| 5,986,938 A | * | 11/1999 | Jang | 365/185.23 |

* cited by examiner

Primary Examiner—David Lam
(74) Attorney, Agent, or Firm—Schwegman, Lundberg, Woessner & Kluth, P.A.

(57) ABSTRACT

A memory device includes a plurality of memory banks and a plurality of bank drivers. Each of the bank drivers connects to a corresponding memory bank. During a memory operation, an input signal is driven to a selected memory bank by activating one more bank drivers but not all of the bank drivers.

54 Claims, 15 Drawing Sheets

DRIVER CONTROL CIRCUIT

FIELD

The present invention relates generally to data processing, and more specifically to driver control circuits in memory devices.

BACKGROUND

Memory devices exist in computers and many electronic products for storing data. A typical memory device has memory banks and corresponding bank drivers. Each bank driver drives a data signal to a corresponding memory bank.

In a typical memory device, only one memory bank is selected at a time to write a data signal. In some memory devices, the drivers are arranged such that all bank drivers receive the data signal and drive it to all memory banks. After the data signal reaches the memory banks, only the selected memory bank writes the data signal. The non-selected memory banks ignore th data signal. Therefore, when only one memory bank is selected, driving the data signal to all memory banks wastes power.

SUMMARY OF THE INVENTION

Embodiments of the inventions provide circuits and methods to drive a signal to a selected memory bank of a memory, device without driving the signal to all memory banks.

In one aspect, the memory device includes a plurality of memory banks, a plurality of drivers, each of the drivers being connected to a corresponding memory bank, and a plurality of driver enable circuits connected to the drivers for activating a subset of the drivers to drive a signal to the memory banks, wherein the subset of the drivers includes fewer drivers than the total number of the drivers.

In another aspect, a method of driving a signal includes selecting a selected memory bank among a plurality of memory banks, and passing an input signal to a plurality of driver enable circuits connected to a plurality of drivers. The method also includes activating a subset of the driver enable circuits, wherein the subset of the driver enable circuits includes a number of driver enable circuits that is less than the total number of the driver enable circuits. In addition, the method includes driving the input signal from the subset of the driver enable circuits to a subset of the drivers, wherein the subset of the drivers includes a number of drivers that is less than the total number of the drivers. The method further includes driving the input signal from the subset of the drivers to the selected memory bank.

DESCRIPTION OF EMBODIMENTS

The following description and the drawings illustrate specific embodiments of the invention sufficiently to enable those skilled in the art to practice it. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
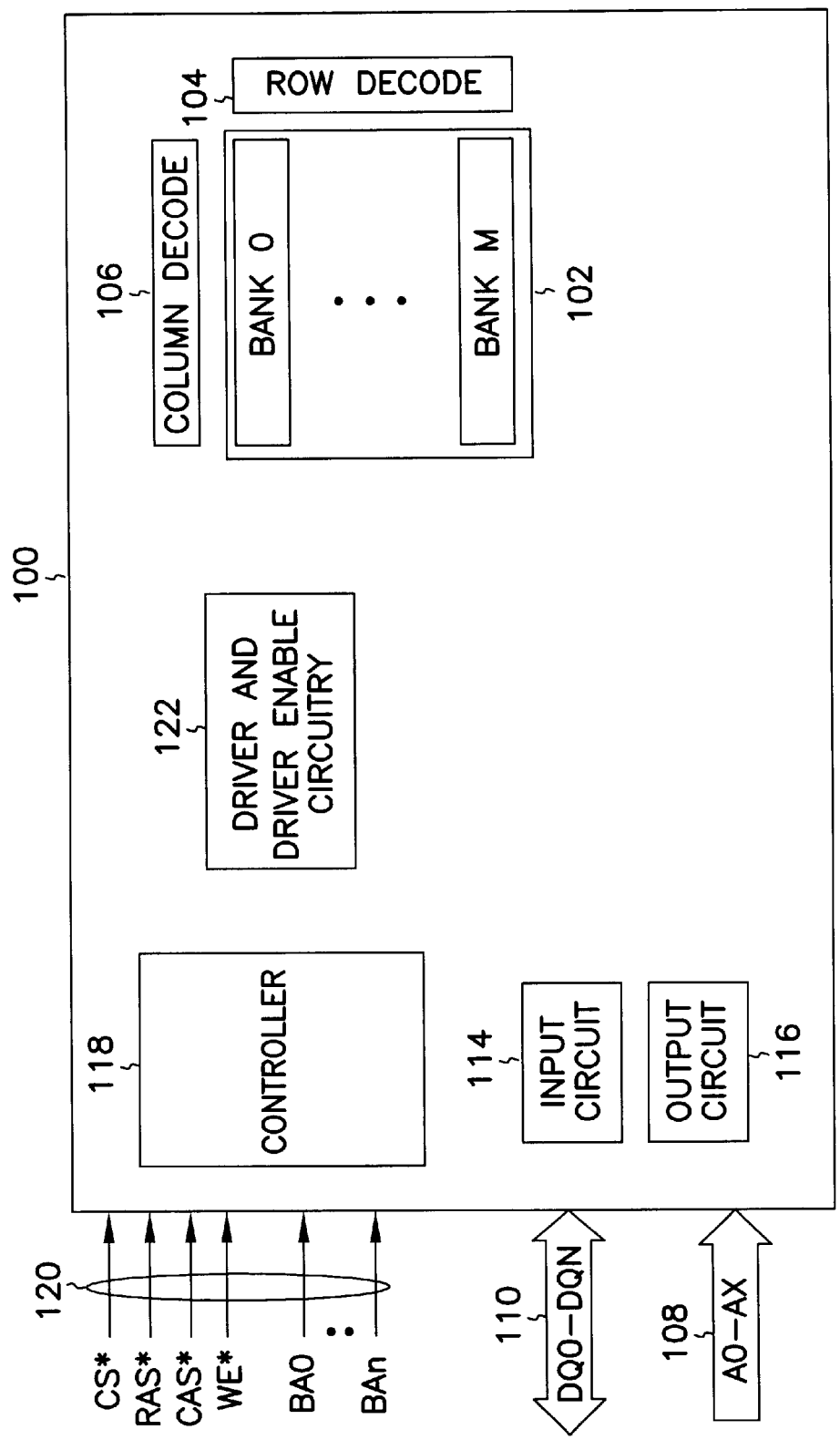
FIG. 1 shows a memory device according to an embodiment of the invention.

FIG. 1 shows a memory device according to an embodiment of the invention. Memory device 100 includes a main memory 102 that has a plurality of memory cells arranged in rows and columns. The memory cells are grouped into a plurality of memory banks indicated by bank 0 through bank M (banks 0–M). Row decode 104 and column decode 106 access the memory cells in response to address signals A0 through AX (A0–AX), provided on address lines (or address bus) 108. An input circuit 114 and an output circuit 116 transfer data between banks 0–M and data lines (or data bus) 110. Data lines 110 carry data signals DQ0 through DQN (DQ0–DQN). A controller 118 controls the operation of memory device 100 based on control signals provided on control input lines 120. The control signals include, but are not limited to, a Chip Select signal CS*, a Row Access Strobe signal RAS*, a Column Access Strobe CAS* signal, a Write Enable signal WE*, Bank Address signals BA0 through BAn (BA0–BAn). Memory device 100 further includes a driver and driver enable circuitry 122 for transferring data from data lines 110 to a selected bank among banks 0–M based on the BA0–BAn signals.

Memory device 100 can be a dynamic random access memory (DRAM) or other type of memory circuit such as SRAM (Static Random Access Memory) or Flash memories. Furthermore, the DRAM can be a synchronous DRAM commonly referred to as SDRAM (Synchronous Dynamic Random Access Memory), SDRAM II, SGRAM (Synchronous Graphics Random Access Memory) or DDR SDRAM (Double Data Rate SDRAM), as well as Synchlink or Rambus DRAMs. Those of ordinary skill in the art will readily recognize that memory device 100 is simplified to illustrate a memory device according to an embodiment of the present invention and is not intended to be a detailed description of all of the features of a memory device.

Memory device 100 has several operational modes including an active mode, a write mode, and a read mode. An operational mode is also referred to as a memory, operation. The active, write, and read modes are similar to that of conventional memory devices known to those skilled in the art. Therefore, detailed operations of these modes are not described here.

In a write mode, controller 118 activates a write signal at the start of the write mode when a certain combination of the signals on control lines 120 is decoded by controller 118 as valid for the write mode. During the write mode, the DQ0–DQN signals are passed to input circuit 114 and are subsequently written into memory cells of barks 0–M.

In a read mode, controller 118 activates a read signal at the start of the read mode when a certain combination of the signals on control lines 120 is decoded by controller 118 as valid for the read mode. During the read mode, data is read from memory cells of banks 0–M. The data is passed to output circuit 116 and is subsequently output to data lines 110.

In some embodiments, before the data is written into the memory cells, or before the data is read from the memory cells, an active mode is performed. Controller 118 activates an active signal at the start of the active mode when a certain combination of the signals on control lines 120 is decoded by controller 118 as valid for the active, mode. During the active mode, a row of memory cells in one of banks 0–M is activated (or opened) in preparation for the write or the read mode. A combination of the BA0–BAn signals selects the bank. A combination of the address signals A0–AX selects the row. If a write mode follows the active mode, the activated row is accessed and data is written into the memory cells of the activated row. If a read mode follows the active mode, the activated row is accessed and data is read from the memory cells of the activated row.

Further, controller 118 enables driver and driver enable circuitry 122 to drive each of the DQ0–DQN signals from input circuit 114 to a selected memory bank based on a combination of the BA0–BAn signals.

Figure 2:
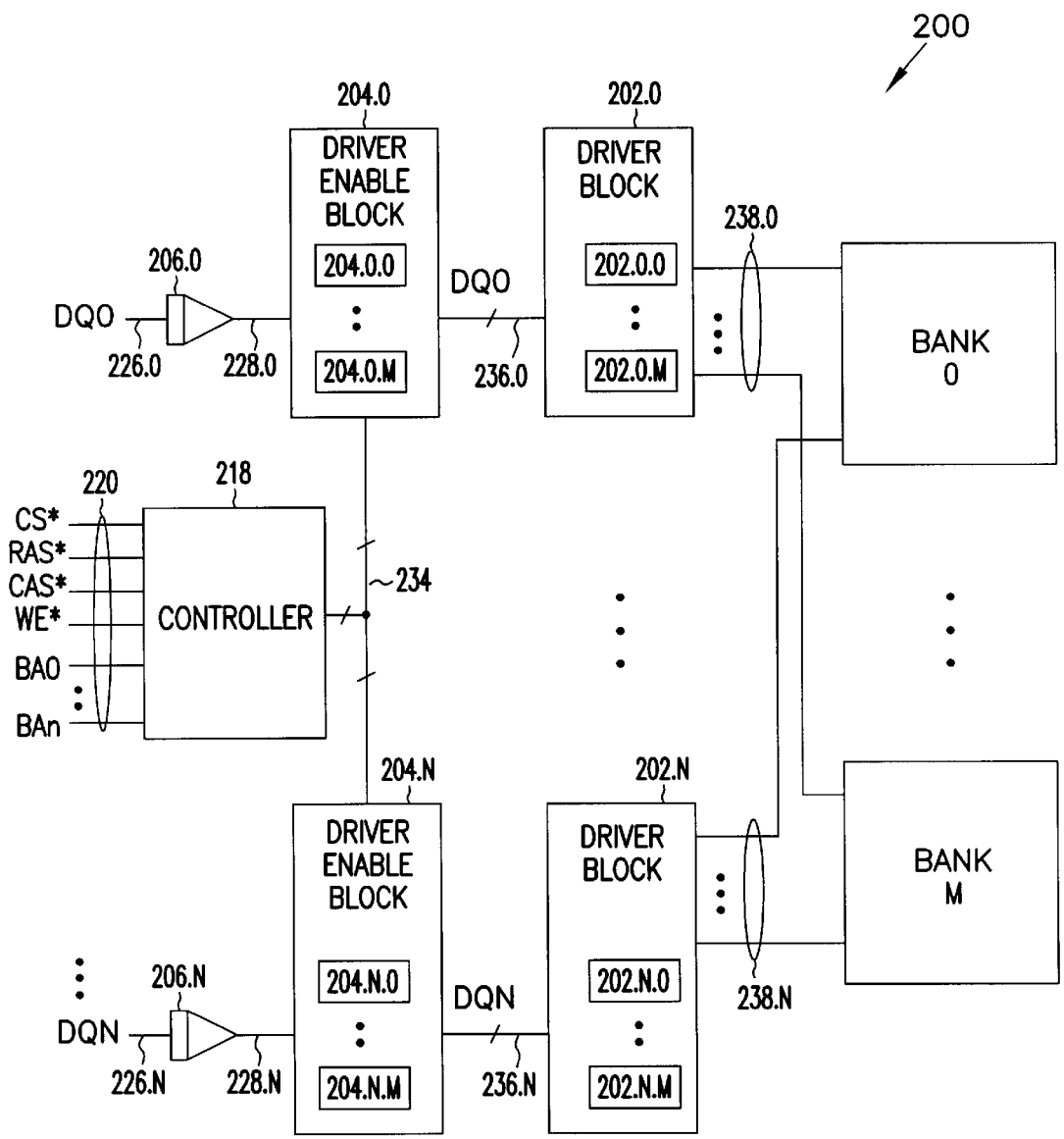
FIG. 2 shows a portion of a memory device according to an embodiment of the invention.

FIG. 2 shows a portion of a memory device according to an embodiment of the invention. Portion 200 represents a portion of memory device 100 (FIG. 1). Portion 200 includes a plurality of memory banks, banks 0–M, a plurality of driver blocks 202.0 through 202.N, a plurality of driver enable blocks 204.0 through 204.N, a plurality of input buffers 206.0 through 206.N, and a controller 218.

Controller 218 represents controller 118 (FIG. 1). Input buffers 206.0–206.N form an input circuit corresponding to input circuit 114 (FIG. 1). Driver blocks 202.0–202.N and driver enable blocks 204.0–204.N form a driver and driver enable circuitry corresponding to driver and driver enable circuitry 122 (FIG. 1). Banks 0–M are similar in both FIG. 1 and FIG. 2.

Controller 218 includes a plurality of control input lines 220 to receive a plurality of control signals CS*, RAS*, CAS*, WE*, and BA0–BAn. These control signals are similar in both FIG. 1 and FIG. 2. Controller 218 connects to driver enable blocks 204.0–204.N via a control bus 234.

Each of input buffers 206.0–206.N has an input node to receive an input signal and an output to output an output signal. The output node of each input buffer connects to a corresponding internal node. For example, input buffer 206.0 has an input connected to node 226.0 to receive the DQ0 signal. The output of input buffer 206.0 connects to internal node 228.0 to pass the DQ0 signal. As another example, input buffer 206.N has an input node 226.N to receive the DQN. The output of input buffer 206.N connects to internal node 228.N to pass the DQN signal. Each of input buffers 206.0–206.N connects to a corresponding driver enable block to pass one of the DQ0–DQN signals to the corresponding driver enable block. For example, input buffer 206.0 passes the DQ0 signal to driver enable block 204.0. As another example, input buffer 206.N passes the DQN signal to driver enable block 204.N.

Each of driver enable blocks 204.0–204.N includes a plurality of driver enable circuits. For example, driver enable block 204.0 includes driver enable circuits 204.0.0 through 204.0.M, driver enable block 204.N includes driver enable circuits 204.N.0 through 204.N.M. Within each driver enable block, the driver enable circuits include a plurality of subsets of driver enable circuits. Each subset of driver enable circuits includes one or more driver enable circuits but less than the total number of driver enable circuits. For example, in driver enable block 204.0, a subset of driver enable circuits includes one or more driver enable circuits of driver enable circuits 204.0.0–204.0.M. If M is the total number of driver enable circuits, a subset of driver enable circuits includes less than M driver enable circuits.

Each of driver blocks 202.0–202.N includes a plurality of drivers. For example, driver block 202.0 includes drivers 202.0.0 through 202.0.M; driver block 202.N includes driver 202.N.0 through 202.N.M. Within each driver block, the drivers include a plurality of subsets of drivers. Each subset of drivers includes one or more drivers but less than the total number of drivers. For example, in driver block 202.0, a subset of drivers includes one or more drivers of drivers 202.0.0–202.0.M. If M is the total number of drivers, a subset of drivers includes less than M drivers.

Each of driver enable blocks 204.0–204.N connects to a corresponding driver block via a driver enable bus. For example, driver enable block 204.0 connects to driver block 202.0 via bus 236.0; driver enable block 204.N connects to driver block 202.N via bus 236.N. Each driver block connects to the memory banks via a plurality of bank lines. For example, driver block 204.0 connects to banks 0–M via lines 238.0, driver block 204.N connects to banks 0–M via lines 238.N.

In FIG. 2, bus 234 includes one or more bus lines. Each of bus 236.0 through 236.N includes one or more bus lines. For clarity, each of these buses is indicated in FIG. 2 as a single line.

Each input buffer receives a corresponding input signal and passes a corresponding input signal to its output to a corresponding driver enable block. Controller 218 controls the driver enable blocks such that each of the driver enable blocks passes the corresponding input signal to a corresponding driver block. Subsequently, each of the driver blocks drives the corresponding input signal to a selected memory bank. For example, input buffer 206.0 receives the DQ0 signal and passes it to driver enable block 204.0. Controller 218 controls driver enable block 204.0 such that driver enable block 204.0 passes the DQ0 signal to driver block 202.0. Subsequently, driver block 202.0 drives the DQ0 signal to one of banks 0–M.

In FIG. 2, the driver enable circuits of a driver enable block and the corresponding drivers of a driver block formal plurality of input paths between a corresponding internal node and the memory banks. Each of the input paths includes one or more driver enable circuits and one or more drivers. The input paths have a plurality of subsets of input paths, in which each subset of input paths includes a number of input paths that is less than the total number of the input paths. During an operational mode, an input signal passes from a corresponding internal node to a selected memory bank via a subset of input paths.

In some embodiments, the DQ0 signal passes from node 228.0 to bank 0 through a subset of the input paths, in which the subset includes only driver enable circuit 204.0.0 and only driver 202.0.0. In other embodiments, the DQ0 signal passes from node 228.0 to bank 0 through a subset of the input paths, in which the subset includes one or more driver enable circuits of driver enable circuits 204.0.0–204.0.N and one more of drivers 202.0.0–202.0.N. In some of these embodiments, the DQ0 signal passes from node 228.0 to bank 0 through a subset of the input paths, in which the subset includes half of driver enable circuits 204.0.0–204.0.M and half of drivers 202.0.0–202.0.M.

Controller 218 activates driver enable blocks 204.0-204.N to drive the DQ0–DQN to memory banks 0–M via driver blocks 202.0–202.N in different operational modes. In some embodiments, controller 218 activates driver enable blocks 204.0–204.N to drive the DQ0–DQN to driver blocks 202.0–202.N in the active mode. In other embodiments, controller 218 activates driver enable blocks 204.0–204.N to drive the DQ0–DQN to driver blocks 202.0–202.N in the write mode.

Figure 3:
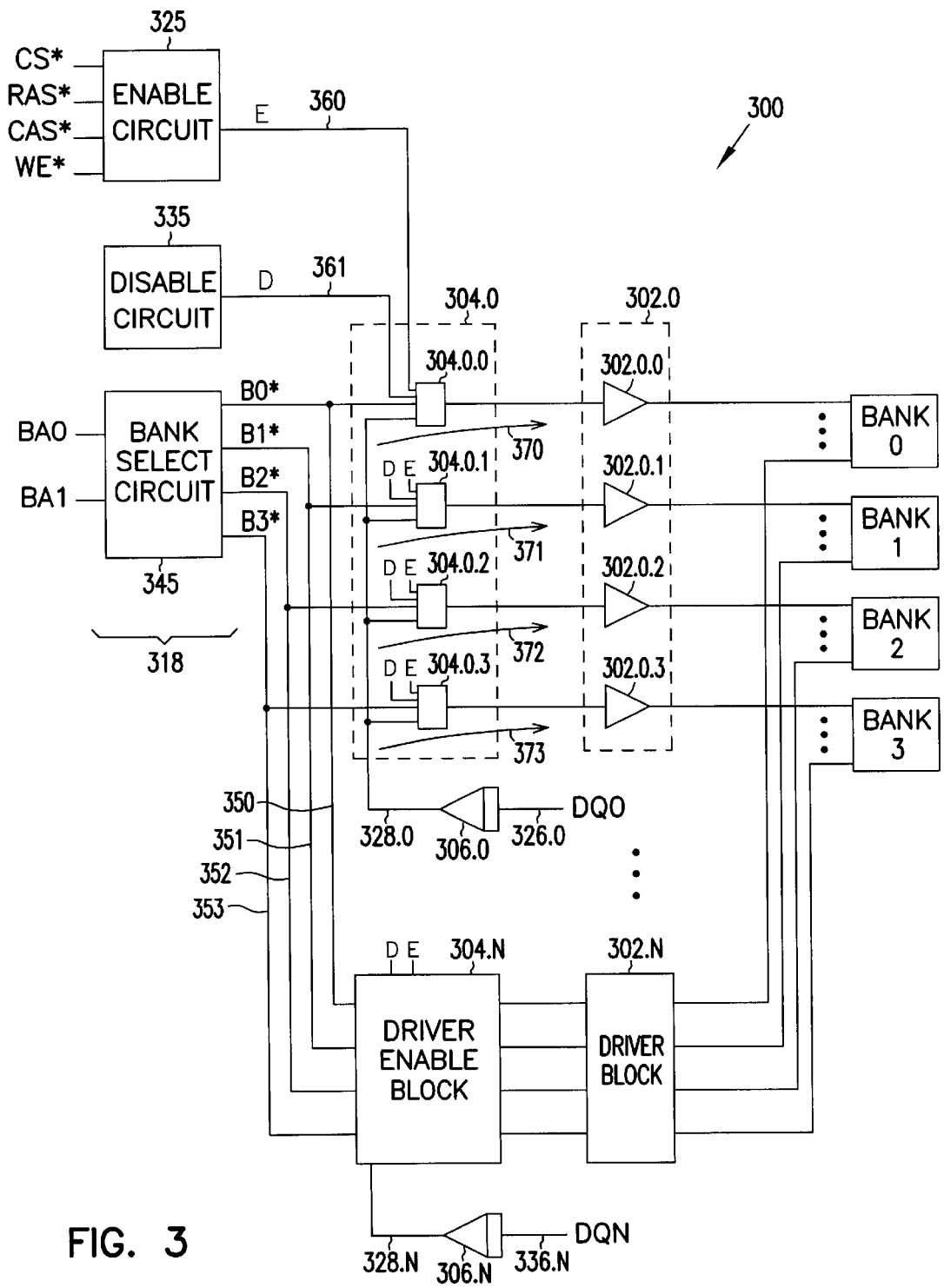
FIG. 3 shows a portion of a memory device according to another embodiment of the invention.

FIG. 3 shows a portion of a memory device according to another embodiment of the invention. Portion 300 represents embodiments of portion 200 (FIG. 2). Portion 300 includes a plurality of memory banks, banks 0–3, a plurality of driver blocks 302.0 through 302.N, a plurality of driver enable blocks 304.0 through 304.N, a plurality of input buffers 306.0 through 306.N, an enable circuit 325, a disable circuit 335, and a bank select circuit 345.

Enable circuit 325, disable circuit 335, and bank select circuit 345 form a controller 318 corresponding to controller 218 (FIG. 2). Input buffers 306.0–306.N represent input buffers 206.0–206.N (FIG. 2). Driver enable blocks 304.0–304.N represent driver blocks 204.0–204.N (FIG. 2). Driver blocks 302.0–302.N represent driver blocks 202.0–202.N (FIG. 2). Banks 0–3 represent banks 0–M (FIG. 2).

Each of input buffers 306.0–306.N has an input node to receive an input signal and an output node to output an output signal. The output node of each input buffer connects to an internal node. For example, input buffer 306.0 has an input node connected to node 326.0 to receive the DQ0 signal. The output node of input buffer 306.0 connects to internal node 328.0 to pass the DQ0 signal.

Enable circuit 325 includes input nodes to receive the CS*, RAS*, CAS*, and WE* signals, and an output node 360 to output an enable signal E. Disable circuit 335 outputs a disable signal D on line 361.

Bank select circuit 345 includes input nodes to receive the BA0 and BA1 signals, and output nodes connected to lines 350, 351, 352, and 353 to output signals B0*, B1*, B2*, and B3*. The BA0 and BA1 signals are bank input signals representing the BA0-BAn signals (FIG. 2). The B0*–B3* signals are bank select signals. Each combination of the BA0 and BA1 signals activates a different bank select signal. For example, a first combination of the BA0 and BA1 signals activates the B0* signal; a second combination of the BA0 and BA1 signal activates the B1* signal; a third combination of the BA0 and BA1 signal activates the B2* signal; and a fourth combination of the BA0 and BA1 signal activates the B3* signal.

Each of driver blocks 302.0–302.N includes a plurality of drivers. For example, driver block 302.0 includes drivers 302.0.0 through 302.0.3 corresponding to drivers 202.0.0–202.0.M (FIG. 2). In FIG. 3, in each driver block, the drivers connect in parallel with each other. The drivers also connect in parallel between the memory banks and a corresponding internal node. Drivers 302.0.0–302.0.3 include a plurality of subsets of drivers. In FIG. 3, a subset of drivers includes one driver. For example, each of drivers 302.0.0–302.0.3 by itself is a subset of drivers.

Each of driver enable blocks 304.0–304.N includes a plurality of driver enable circuits. For example, driver enable block 304.0 includes driver enable circuits 304.0.0 through 304.0.3 corresponding to driver enable circuits 204.0.0–204.0.M (FIG. 2). The driver enable circuits connect in parallel with each other. The driver enable circuits also connect in parallel between the memory banks and a corresponding internal node. Driver enable circuits 304.0.0–304.0.3 include a plurality of subsets of driver enable circuits. In FIG. 3, a subset of driver enable circuits includes one driver enable circuit. For example, each of driver enable circuits 304.0.0–304.0.3 by itself is a subset of driver enable circuits.

Other driver blocks and driver enable blocks such as driver block 302.N and driver enable block 304.N have elements similar to elements of driver block 302.0 and driver enable block 304.0. For clarity, these elements are not shown in the other blocks.

Each of driver enable circuits 304.0.0–304.0.3 includes a plurality of input nodes: a first driver control input node connects to line 360 to receive an enable signal E, a second driver control input node connects to line 361 to receive a disable signal D, a select input node connects to one of lines 350–353 to receive one of bank select signals B0*–B3*, and a driver data input node connects to one of internal nodes 328.0–328.N to receive one of the DQ0–DQN signals. Within the same driver enable block, the internal node connects to all data input nodes of the driver enable circuit. For example, within driver enable block 304.0, internal node 328.0 connects to the data input nodes of all driver enable circuits 304.0.0–304.0.3.

Driver enable circuits 304.0.0–304.0.3 and the drivers 302.0.0–302.0.3.form a plurality of input paths 370, 371, 372, and 373. Each of input paths 370–373 connects between internal node 328.0 and a corresponding memory bank. Internal node 328.0 is common to all input paths 370–373. Input path 370 connects between node 328.0 and bank 0; input path 371 connects between node 328.0 and bank 1; input path 372 connects between node 328.0 and bank 2; and input path 373 connects between node 328.0 and bank 3. Each input path includes one driver enable circuit and one driver. For example, input path 370 includes driver enable circuit 304.0.0 and driver 302.0.0.

Input paths 370–373 include a plurality of subsets of input paths. In FIG. 3, a subset of input paths includes one input path. For example, each of input paths 370–373 by itself is a subset of the input paths.

An input signal passes from the internal node to a selected memory bank via a subset of the input paths, where the subset of the input path includes one input path. For example, after input buffer 306.0 passes the DQ0 to internal node 328.0, the DQ0 signal passes to one of banks 0–M via one of input paths 370–373. Bank select circuit 345 activates one of the B0*–B3* signals to select which bank the DQ0 signal will be passed to. For example, bank select circuit 345 activates the B0* signal to allow the DQ0 signal to pass to bank 0 via input path 370. In this case, the subset of the input paths includes only input path 370 which includes driver enable circuit 304.0.0 and driver 302.0.0. Thus, in FIG. 3, only one driver enable circuit and only one driver are activated to drive a corresponding input signal from a corresponding internal node to any one selected memory bank.

Figure 4:
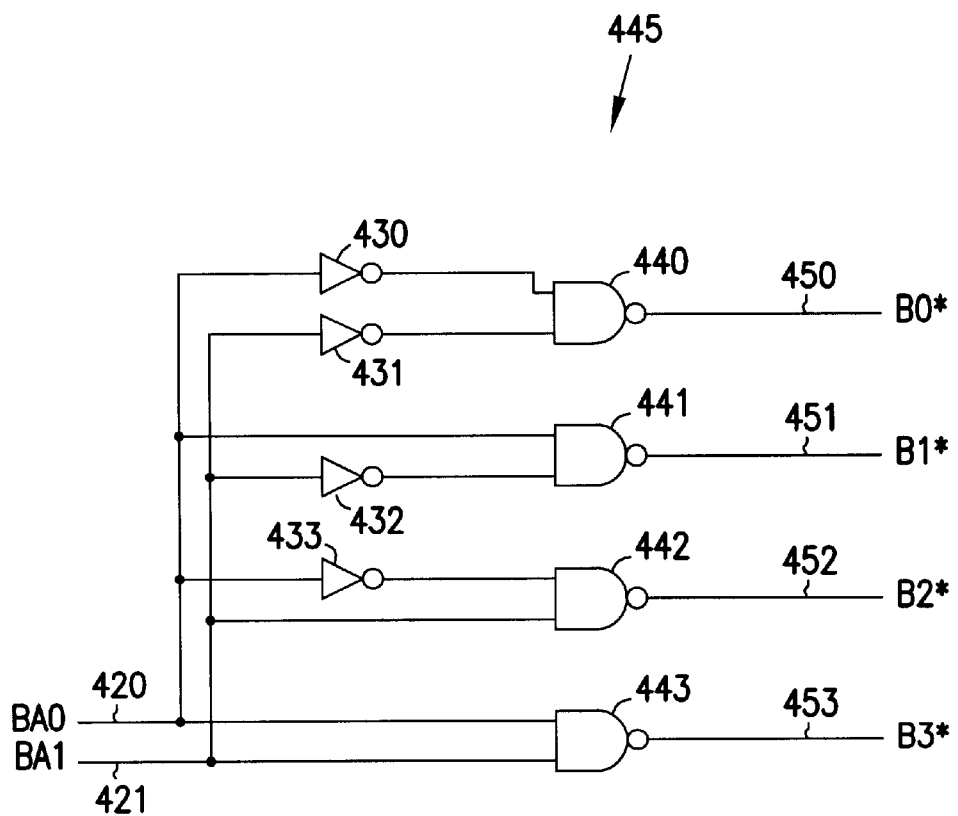
FIG. 4 shows a bank select circuit according to an embodiment of the invention.

FIG. 4 shows a bank select circuit according to an embodiment of the invention. Bank select circuit 445 represents bank select circuit 345 (FIG. 3). In FIG. 4, bank select circuit 445 includes a plurality of inverters 430, 431, 432, and 433, and a plurality of NAND gates 440, 441, 442, and 443. Inverters 430–433 and NAND gates 440–443 form a decoder circuit to decode two input signals received at input nodes 420 and 421 and to output four output signals at output nodes 450, 451, 452, and 453. Input nodes 420 and 421 receive bank input signals BA0 and BA1. Output nodes 450453 output bank select signals B0*–B3*. Bank select circuit 445 activates only one of the B0*–B3* signals based on a combination of the BA0 and BA1 signals. The BA0, BA1, and B0*–B3* signals are similar in both FIG. 3 and FIG. 4.

In some embodiments, each of the BA0 and BA1 signals has a low signal level (low) and a high signal level (high). For each combination of the BA0 and BA1 signal, bank select circuit 445 activates one of the B0*–B3* signals. In FIG. 4, a bank select signal is activated when it has a low signal level. For example, when both of the BA0 and BA1 signals are low, the B0* signal is activated (low). When both of the BA0 and BA1 signals are high, the B3* signal is activated (low). Other combinations of the BA0 and BA1 signals activate the B1* and B2* signals, respectively.

Figure 5:
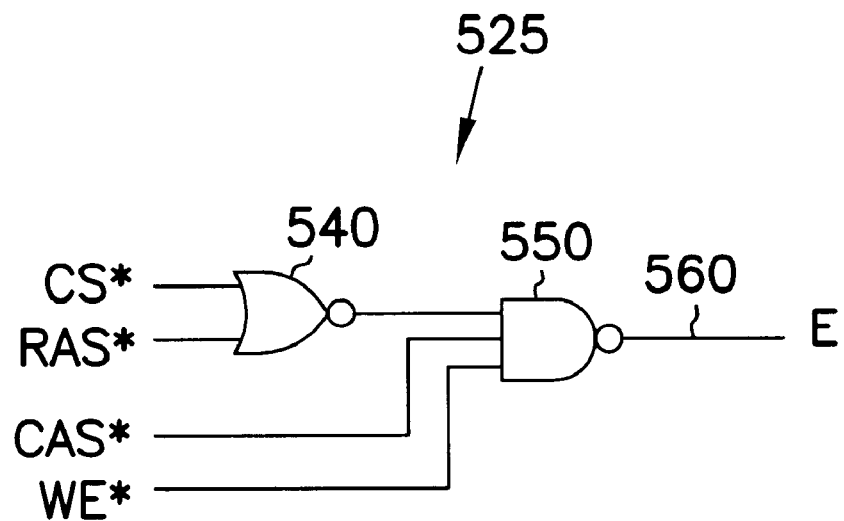
FIG. 5 shows an enable circuit according to an embodiment of the invention.

FIG. 5 shows an enable circuit according to an embodiment of the invention. Enable circuit 525 represents enable circuit 325 (FIG. 3). Enable circuit 525 includes a NOR gate 540 and a NAND gate 550. These gates form a combinatorial logic that operates on the control input signals CS*, RAS*, CAS*, and WE*, and outputs an enable signal E on output node 560. The E signals are similar in both FIG. 3 and FIG. 5. The CS*, RAS*, CAS*, and WE* signals are similar in FIGS. 1–3 and FIG. 5.

Enable circuit 525 activates the E signal based on a combination of the CS*, RAS*, CAS*, and WE* signals. The E signal is activated when it has a low signal level. In some embodiments, the E signal is activated during the active mode of a memory device. As described previously in reference with memory device 100 (FIG. 1), the active mode occurs when a certain combination of the signals on line 120 is decoded as valid for the active mode. In some embodiments, the active mode occurs when the CS*, RAS*, CAS*, and WE* are low, low, high, and high, respectively: Based on this combination, enable circuit 525 activates the E signal (low).

Figure 6:
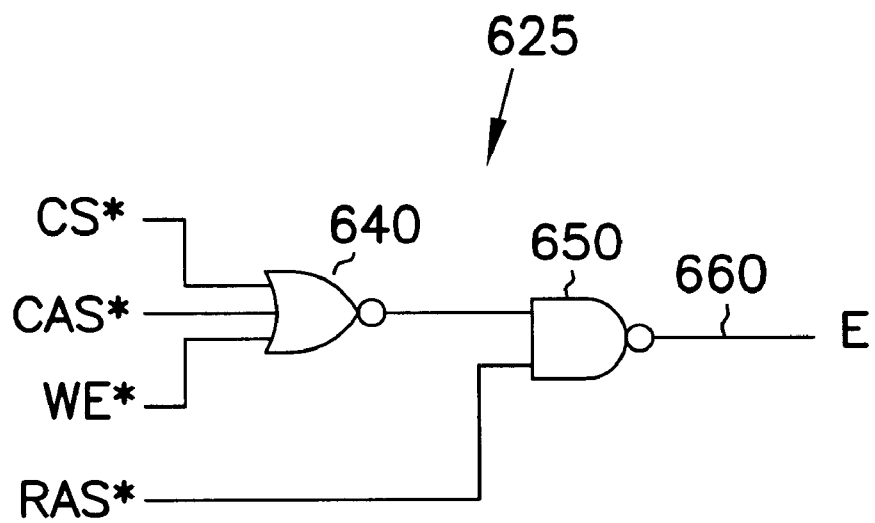
FIG. 6 shows an enable circuit according to another embodiment of the invention.

FIG. 6 shows an enable circuit according to an embodiment of the invention. Enable circuit 625 represents enable circuit 325 (FIG. 3). Enable circuit 625 includes a NOR gate 640 and a NAND gate 650. These gates form a combinatorial logic that operates on the control input signals CS*, RAS*, CAS*, and WE*, and outputs an enable signal E on output node 660. The E signals are similar in FIG. 3 and FIG. 6. The CS*, RAS*, CAS*, and WE* signals are similar in FIGS. 1–3 and FIG. 6.

Enable circuit 625 activates the E signal based on a combination of the CS*, RAS*, CAS*, and WE*. The E signal is activated when it has a low signal level. In some embodiments, the E signal is activated during the write mode of a memory device. As described previously in reference with memory device 100 (FIG. 1), the write mode occurs when certain combination of the signals on line 120 (FIG. 1) is decoded as valid for the write mode. For example, in some embodiments, the write mode occurs when the CS*, RAS*, CAS*, and WE* are low, high, low, and low respectively. Based on this combination, enable circuit 625 activates the E signal (low).

Figure 7:
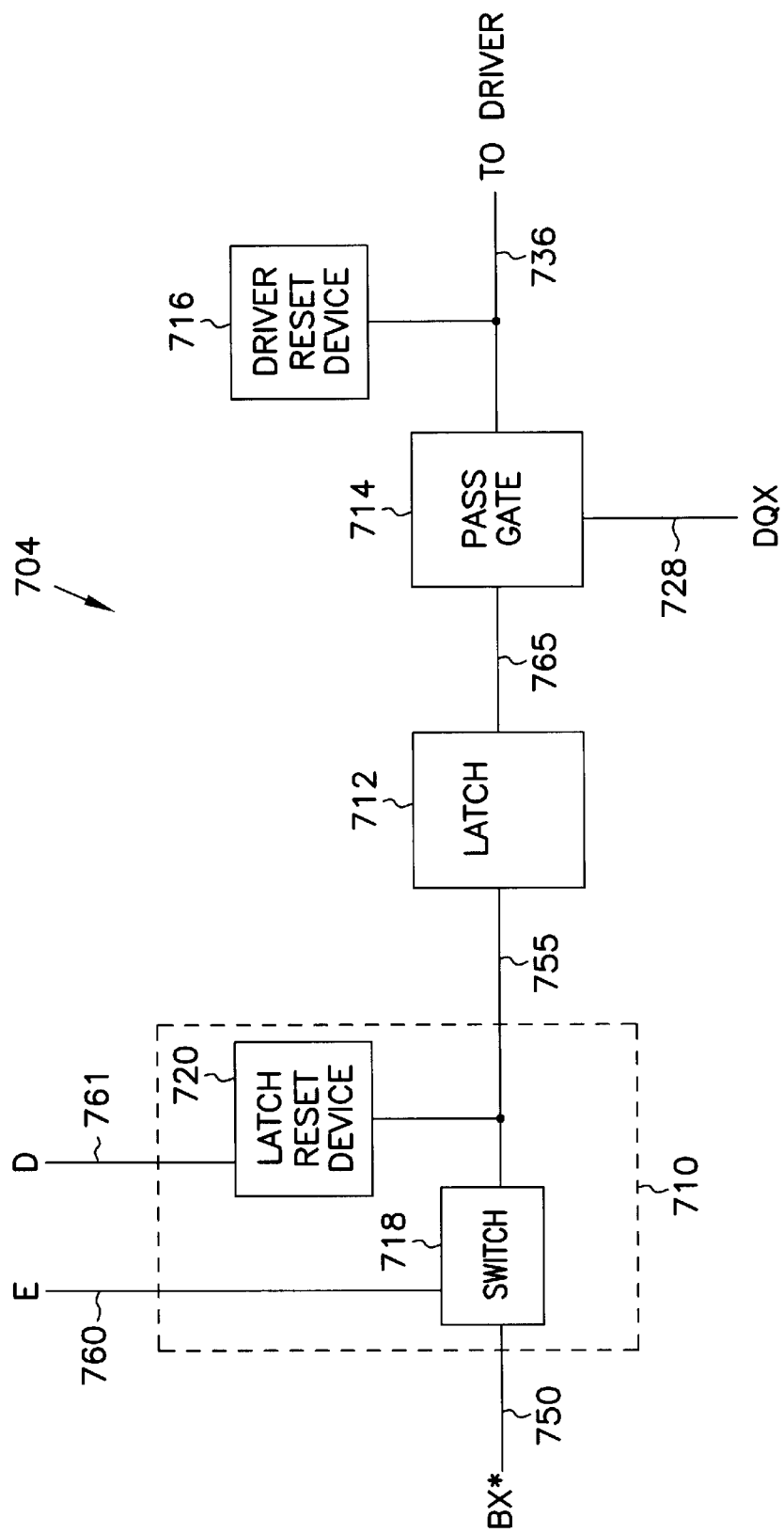
FIG. 7 shows a driver enable circuit according to an embodiment of the invention.

FIG. 7 is a diagram of a driver enable circuit according to an embodiment of the invention. Driver enable circuit 704 represents each of driver enable circuits 204.0.0–204.0.M (FIG. 2) and each of driver enable circuits 304.0.0–304.0.3 (FIG. 3). Driver enable circuit 704 includes a driver enable control unit 710, a latch 712, a pass gate 714, and a driver reset device 716. In some embodiments, driver reset device 716 is omitted.

Driver enable control unit 710 includes a switch 718 and a latch reset device 720. Switch 718 connects to a select input node 750 for receiving a bank select signal BX* and to a first driver control input node 760 for receiving an enable signal E. Switch 718 connects to latch 712 at node 755. Latch reset device 720 connects to latch 712 at node 755 and to a second driver control input node 761 for receiving a disable signal D. In some embodiments, latch reset device 720 connects to node 765.

Latch 712 has an input node connected to node 755, and an output node connected to node 765. Pass gate 714 has an input node connected to a driver data input node 728 for receiving an input signal DQX, and an output node connected to node 736 for passing the DQX signal. Node 736 connects to a corresponding driver such as one of drivers 302.0.0–302.0.3 (FIG. 3). Driver reset device 716 connects to node 736.

The BX* signal represents one of the B0*–B3* signals (FIG. 3). Driver control input nodes 760 and 761 are similar to nodes 360 and 361 (FIG. 3). The E and D signals are similar in both FIG. 3 and FIG. 7. The DQX signal represents one of the DQ0–DQN signals (FIG. 3). Driver data input node 728 is similar to one of interval nodes 328.0–328.N (FIG. 3).

In operation, the E signal is activated to turn on switch 718. When switch 718 turns on, it passes the BX* signal from node 750 to node 755. Latch 712 latches the BX* signal from node 755 and activates (turns on) pass gate 714. When pass gate 714 is activated, it passes the DQX signal from node 728 to node 736. The DQX signal passes from node 736 to a corresponding driver.

When the E signal is activated, the D signal is deactivated. Therefore, node 755 is unaffected by the D signal. Pass gate 714 remains activated to pass the DQX signal to node 736 as long as latch 712 remains in the same state (level) when it latched the BX* signal and when the D signal is deactivated. Latch 712 changes state to deactivate (turn off or disable) pass gate 714 when the D signal is activated. In some embodiments, when pass gate 714 is deactivated (turned off), driver reset device 716 resets a corresponding driver that connects to node 736. For example, driver reset device 716 resets a corresponding driver by applying a reset voltage to node 736. In some embodiments, the reset voltage is a fixed voltage. In some embodiments, the reset voltage equals ground. In other embodiments, the reset voltage equals the supply voltage (Vcc).

Figure 8:
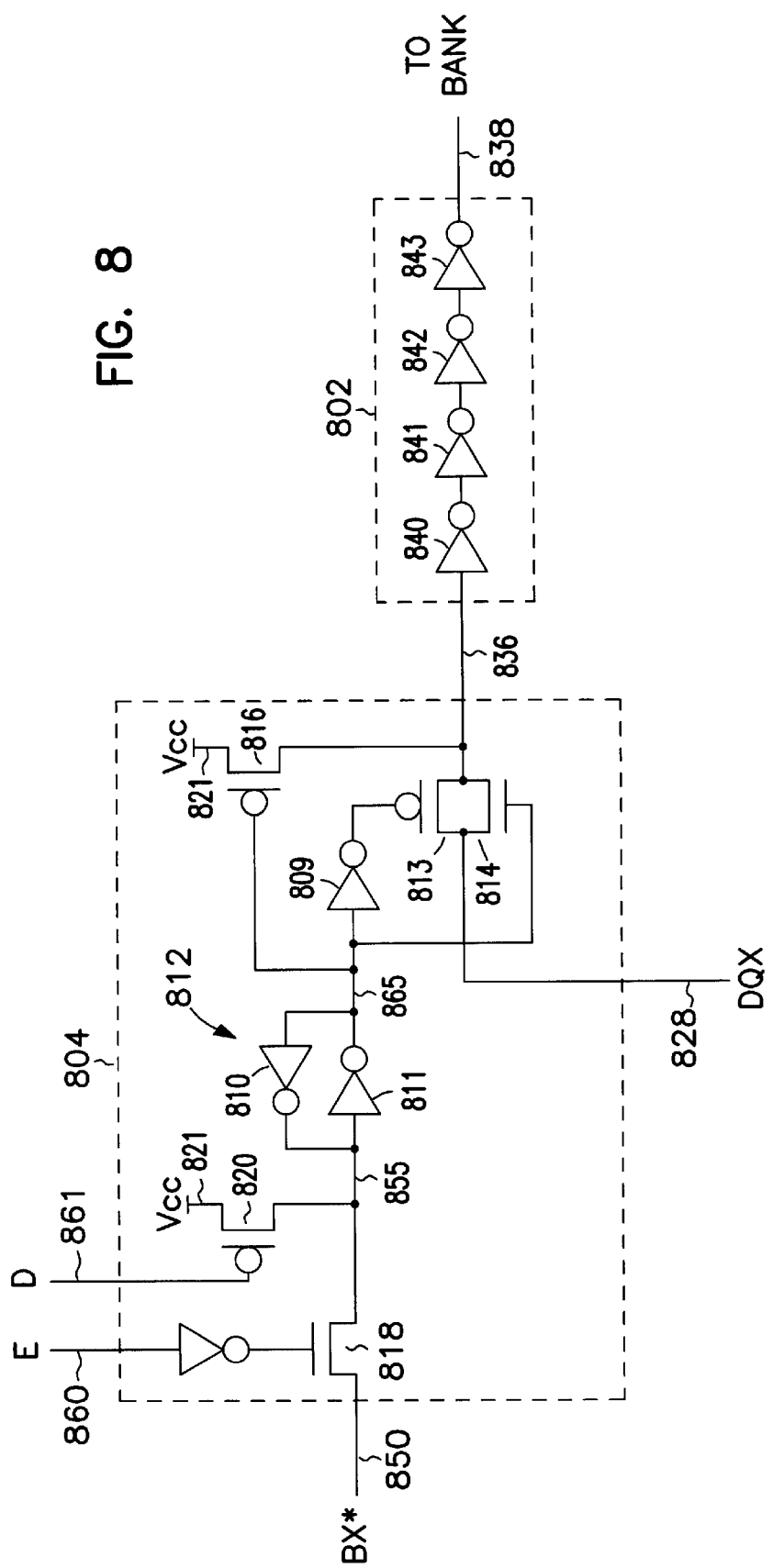
FIG. 8 shows a driver enable circuit and a driver according to an embodiment of the invention.

FIG. 8 shows a driver enable circuit and a driver according to an embodiment of the invention. Driver enable circuit 804 represents driver enable circuit 704 (FIG. 7) and each of driver enable circuits 304.0.0–304.0.3 (FIG. 3). Driver 802 represents each of drivers 302.0.0–302.0.3 (FIG. 3).

Driver enable circuit 804 includes a pass transistor 818, a latch reset transistor 820, a driver reset transistor 816, transistors 813, 814, and inverters 809, 810, and 811. Transistors 816 and 820 connect to a supply node 821. In some embodiments, supply node 821 has a non-ground potential. In other embodiments, supply node 821 has a potential equal to the supply voltage Vcc. Transistor 818 forms a switch corresponding to switch 718 (FIG. 7). Transistor 820 forms a latch reset device switch corresponding to latch reset device 720 (FIG. 7). Inverters 810 and 811 form a latch 812 corresponding to latch 712 (FIG. 7). Transistor 816 forms a driver reset device corresponding to driver reset device 716 (FIG. 7). Inverter 809 and transistors 813 and 814 form a pass gate corresponding to pass gate 714 (FIG. 7). Nodes 850, 860, 861, 828, and 836 are similar to nodes 750, 760, 761, 728, and 736 of FIG. 7.

Driver 802 includes a plurality of inverters 840, 841, 842, and 843 connected in series between node 836 and 838. Node 838 connects to a corresponding memory bank such as one of banks 0–3 (FIG. 3).

In operation, the E signal is activated (low) to turn on transistor 818. When transistor 818 turns on, it passes the BX* from node 850 to node 855. Latch 812 latches the BX* signal from node 855. When the BX* signal is low at node 850, node 865 is high, causing transistors 813 and 814 to turn on (activate). When transistors 813 and 814 turn on, it passes the DQX signal from node 828 to node 836. The DQX signal passes from node 836 to driver 802. Subsequently, driver 802 drives the DQX signal to a corresponding memory bank that connects to node 838.

Transistors 813 and 814 remain on to pass the DQX signal to driver 802 as long as latch 812 keeps node 865 high. Latch 812 changes node 865 to low to turn off (deactivate) transistors 813 and 814 when the D signal is activated (low). When the D signal is low, transistor 820 turns on. When transistor 820 turns on, it pulls node 855 to Vcc (high). When node 855 is high, node 865 is low causing transistors 813 and 814 to turn off and transistor 816 to turn on. When transistor 816 turns on, it pulls node 836 to Vcc or high. Node 836 remains high as long as transistors 813 and 814 turn off.

In FIG. 8, driver 802 is activated when the DQX signal is passed to node 836 by transistors 813 and 814. Driver 802 is reset when transistor 816 keeps node 836 at the same level (state) and when transistors 813 and 814 turn off. Driver enable circuit 804 is activated when the BX* and E signal are activated (low) and the D signal is deactivated (high).

Figure 9:
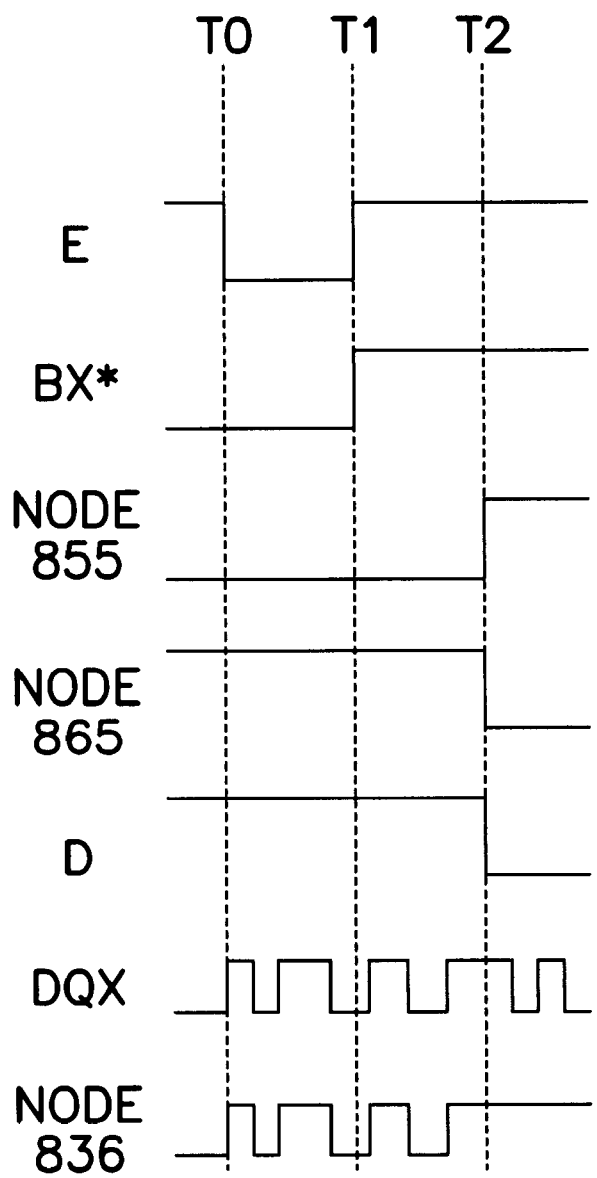
FIG. 9 is a timing diagram of the operation of the driver enable circuit and the driver of FIG. 8.

FIG. 9 is a timing diagram of the operation of the driver enable circuit and the driver of FIG. 8. In FIG. 9, the signals BX*, E, D, and DQX correspond to the same signals of FIG. 8. The signals indicated by "node 855", "node 865", and "node 836" represent the signals of node 855, node 865, and node 836 of FIG. 8. T0, T1, and T2 represent time.

Referring to FIG. 8 and FIG. 9, the E signal is activated (low) low at time T0, to turn on transistor 818 to pass the BX* signal from node 850 to node 855. At time T1 the E signal is deactivated (high) causing transistor 818 to turn off and the BX* is no longer passed to node 855. Between times T0 and T1, the BX* signal is activated (low). When transistor 818 turns on between times T0 and T1, the signal at node 855 follows the BX* signal (low). Inverter 811 of latch 812 causes the signal at node 865 to be an inverse version of the signal at node 855. At time T1, The BX* signal switches from low to high, however, the signal at node 855 does not switch to high because the E signal turns off transistor 818 at time T1.

Between times T0 and T2, latch 812 keeps node 865 high, causing transistors 813 and 814 to turn on to pass the DQX signal from node 828 to node 836. In FIG. 9, the signal levels of node 836 the DQX signal are the same. Between times T0 and T2, transistor 820 is off because the D signal is high. At time T2, the D signal switches from high to low causing transistor 820 to turn on. When transistor 820 turns on, it pulls node 855 high, causing node 865 low. When node 865 is low at time T2, transistors 813 and 814 turn off and the DQX signal no longer passes from node 828 to node 836 after time T2. Transistor 816 resets node 836 to the same signal level regardless of the signal level of the DQX signal.

In some embodiments, the BX* signal switches from low to high at times other than time T1. For example, in some embodiments, the BX* signal switches from low to high some time after time T1. In these embodiments, the switching of the BX* signal after time T1 does not change the operation of driver enable circuit 804 because latch 812 has already latched the BX* between time T0 and T1.

Figure 10:
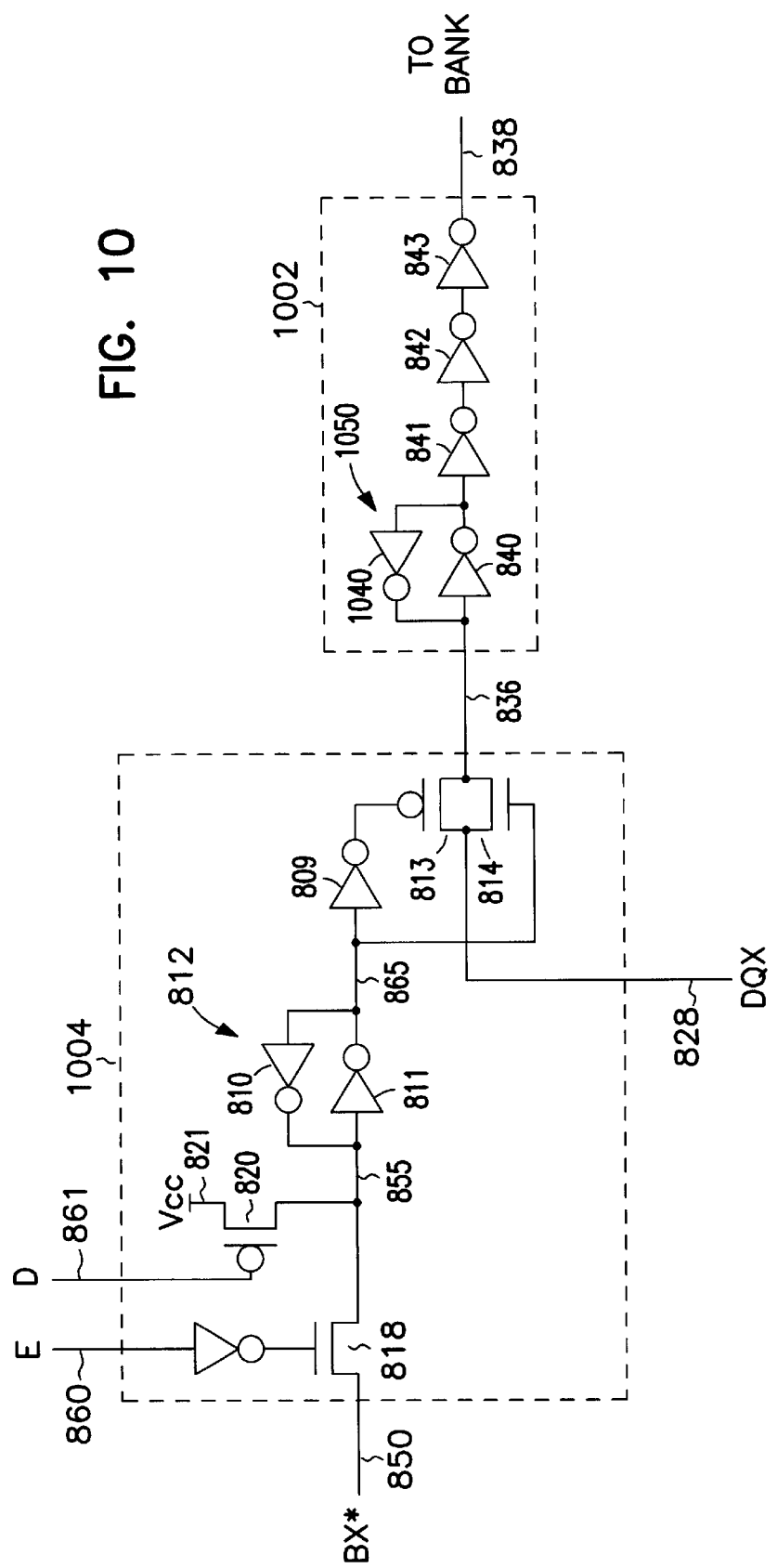
FIG. 10 shows a driver enable circuit and a driver according to another embodiment of the invention.

FIG. 10 shows a driver enable circuit and a driver according to another embodiment of the invention. Driver enable circuit 1004 represents driver enable circuit 704 (FIG. 7) and each of driver enable circuits 304.0.0–304.0.3 (FIG. 3). Driver 1002 represents each of drivers 302.0.0–302.0.3 (FIG. 3). Driver enable circuit 1004 includes elements similar to elements of driver enable circuit 804 (FIG. 8). Driver 1002 includes elements similar to elements of driver 802 (FIG. 8). Elements that are similar in FIG. 8 and FIG. 10 have the same reference numbers. Transistor 816 of FIG. 8 is omitted in FIG. 10. Driver 1002 includes an inverter 1040 in addition to inverters 840–843. Inverters 1040 and 840 form a latch 1050.

The operation of driver enable circuit 1004 and driver 1002 are similar to the operation of driver enable circuit 804 and driver 802. Referring back to FIG. 8, when transistors 813 and 814 turn off, transistor 816 resets node 836 to the same level. In FIG. 10, when transistors 813 and 814 turn off, latch 1050 resets node 836 to the same level.

Figure 11:
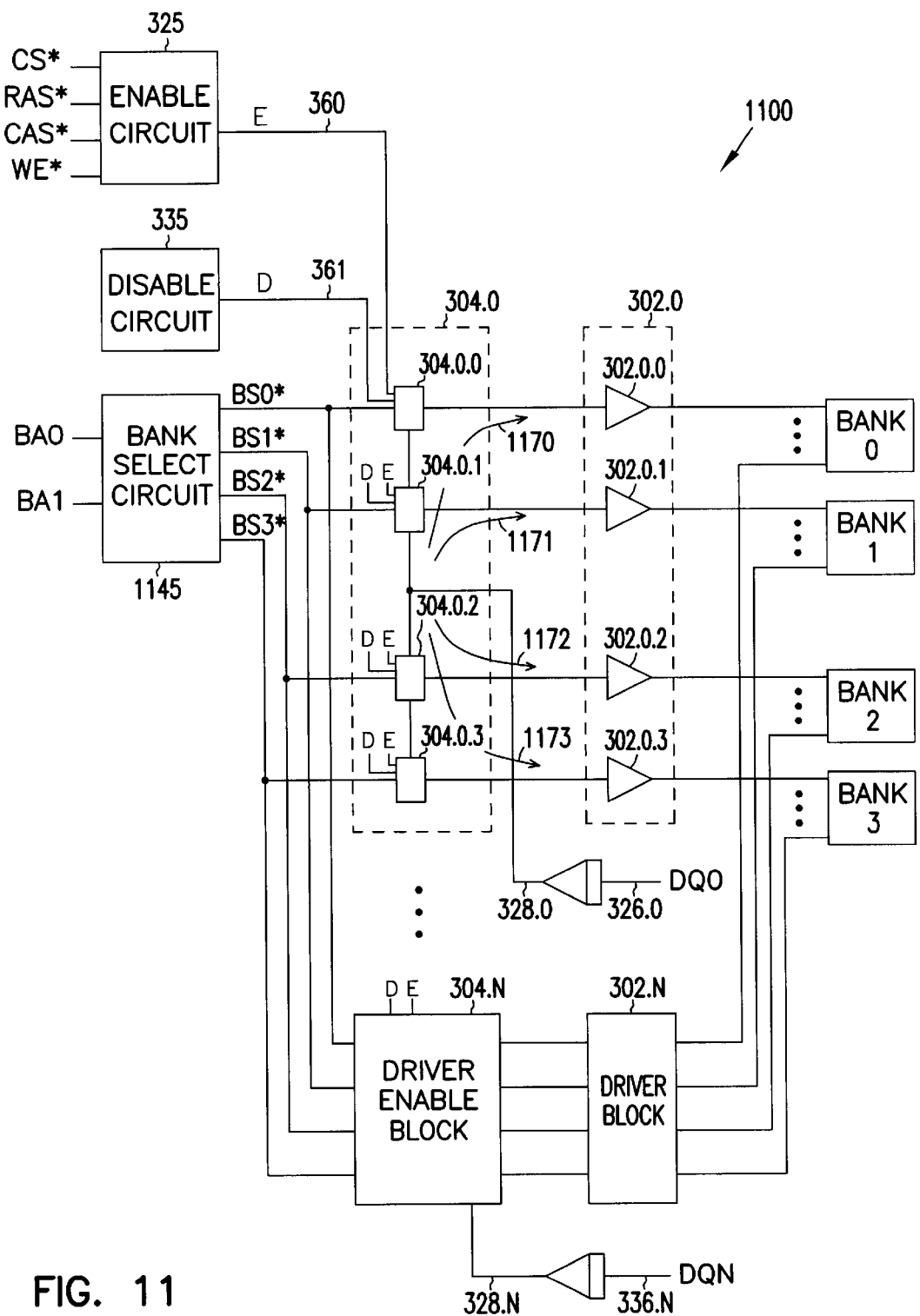
FIG. 11 shows a portion of a memory device according to another embodiment of the invention.
Figure 12:
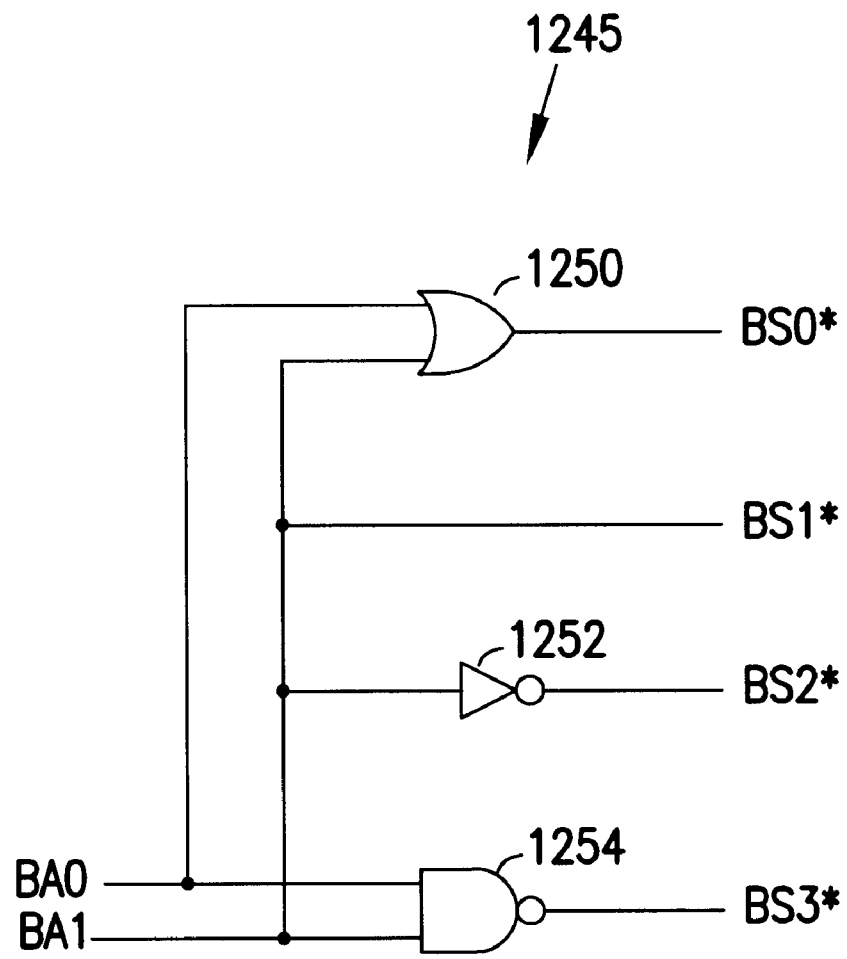
FIG. 12 shows a bank select circuit according to another embodiment of the invention.

FIG. 11 shows a portion of a memory device according to another embodiment of the invention. Portion 1100 represents a portion of memory device 100 (FIG. 1) and represents embodiments of portion 200 (FIG. 2). Portion 1100 includes elements similar to elements of portion 300 (FIG. 3). Elements that are similar in FIG. 3 and FIG. 11 have the same reference numbers. For clarity, some reference numbers from FIG. 3 are omitted in FIG. 11. Bank select circuit 1145 activates bank select signals BS0*, BS1*, BS2*, and BS3*. These bank select signals are activated in a different manner than the B0*–B3* signals (FIG. 3). Embodiments of bank select circuit 1145 is shown in FIG. 12.

In each driver enable block, the driver enable circuits connect in series with each other. The corresponding internal node connects to less than all driver input nodes of the driver enable circuits. For example, in driver enable block 304.0, interrial node 328.0 connects to driver enable circuits 304.0.1 and 304.0.2.

Drivers 302.0.0–302.0.3 include a plurality of subsets of drivers. Each subset of drivers includes one or more drivers but less than all of the drivers. For example, each of drivers 302.0.1 and 302.0.2 by itself is a subset of drivers. Drivers 302.0.1 and 302.0.0 together form another subset of drivers. Drivers 302.0.2 and 302.0.3 together form another subset of drivers.

Driver enable circuits 304.0.0–304.0.3 include a plurality of subsets of driver enable circuits. Each subset of driver enable circuits includes one or more driver enable circuits. For example, each of driver enable circuits 304.0.1 and 304.0.2 by itself is a subset of driver enable circuits. Driver enable circuits 304.0.1 and 304.0.0 together form another subset of driver enable circuits. Driver enable circuits 304.0.2 and 304.0.3 together form another subset of driver enable circuits.

Driver enable circuits 304.0.0–304.0.3 and the drivers 302.0.0–302.0.3 form a plurality of input paths 1170, 1171, 1172, and 1173, each connecting between internal node 328.0 and a corresponding memory bank. Internal node 328.0 is common to all input paths 1170–1173. For example, input path 1170 connects between node 328.0 and bank 0; input path 1171 connects between node 328.0 and bank 1; input path 1172 connects between node 328.0 and bank 2; and input path 1173 connects between node 328.0 and bank 3.

Each input path includes one or more driver enable circuits and one or more drivers. For example, input path 1170 includes driver enable circuits 304.0.1 and 304.0.0 and driver 302.0.0. Input path 1171 includes driver enable circuits 304.0.1 and driver 302.0. 1. Input path 1172 includes driver enable circuits 304.0.2 and driver 302.0.2. Input path 1173 includes driver enable circuits 304.0.2 and 304.0.3 and driver 302.0.3.

Input paths 1170–1173 include a plurality of subsets of input paths. A subset of input paths includes one or more input paths but less than the total number of the input paths. For example, each of input paths 1171 and 1172 by itself is a subset of the input paths. Input paths 1171 and 1170 together form another subset of the input paths. Input paths 1172 and 1173 together form another subset of the input paths.

Each of the driver enable circuits is activated by a corresponding bank select signal. Driver enable circuit 304.0.0 is activated by the BS0* signal; driver enable circuit 304.0.1 is activated by the BS1* signal; driver enable circuit 304.0.2 is activated by the BS2* signal; and driver enable circuit 304.0.3 is activated by the BS3* signal.

An input signal passes from the internal node to a selected memory bank via a subset of the input paths. For example, the DQ0 signal passes from internal node 328.0 to one of banks 0–3 via a one or more input paths 1170–1173 depending on which memory bank is selected. Bank select circuit 1145 activates one or more bank select signals of the BS0*–BS3* signals to activate one or more driver enable circuits to allow the input signal to pass to a selected memory bank via an input path that includes one or more driver enable circuits and one or more drivers. For example, when bank 0 is selected, bank select circuit 1145 activates the BS1* and BS0* signals to activate driver enable circuits 304.0.1 and 304.0.0 to allow the DQ0 signal to pass through them to driver 302.0.0, which drives the DQ0 signal to bank 0. In this case, the DQ0 signal passes to bank 0 via input path 1170. Because driver enable circuit 304.0.1 is activated, the DQ0 signal also passes to bank 1 via input path 1171. However, only the selected bank 0 writes the data represented by the DQ0 signal. The non-selected bank 1 ignores the data.

As another example, when bank 1 is selected, bank select circuit 1145 activates only the BS1* signal to activate driver enable circuit 304.0.1 to allow the DQ0 signal to pass to bank 1 through driver enable circuit 304.0.1 and driver 302.0.1. In this example, the DQ0 signal passes to the selected memory bank only via input path 1171.

FIG. 12 shows a bank select circuit according to another embodiment of the invention. Bank select circuit 1245 represents bank select circuit 1145 (FIG. 11). In FIG. 12, bank select circuit 1245 includes an OR gate 1250, an inverter 1252, and a NAND gate 1254. Bank select circuit 1245 receives bank input signals BA0 and BA1 and activates one or more output bank select signals BS0*–BS3*. The BA0, BA1, and BS0*–BS3* signals are similar in both FIG. 11 and FIG. 2.

In some embodiments, each of the BA0 and BA1 signals has a low signal level (low) and a high signal level (high). For each combination of the BA0 and BA1 signal, bank select circuit 1145 activates one or more bank select signals of the BS0*–BS3* signals. In FIG. 12, a bank,select signal is activated when it has a low signal level. For example, when both of the BA0 and BA1 signals are low, the BS0* and BS1* signal are activated (low). When both of the BA0 and BA1 signals are high, the BS2* and BS3* signals are activated (low). Other combinations of the BA0 and BA1 signals activate only the BS1* signals and only the BS2* signal.

Figure 13:
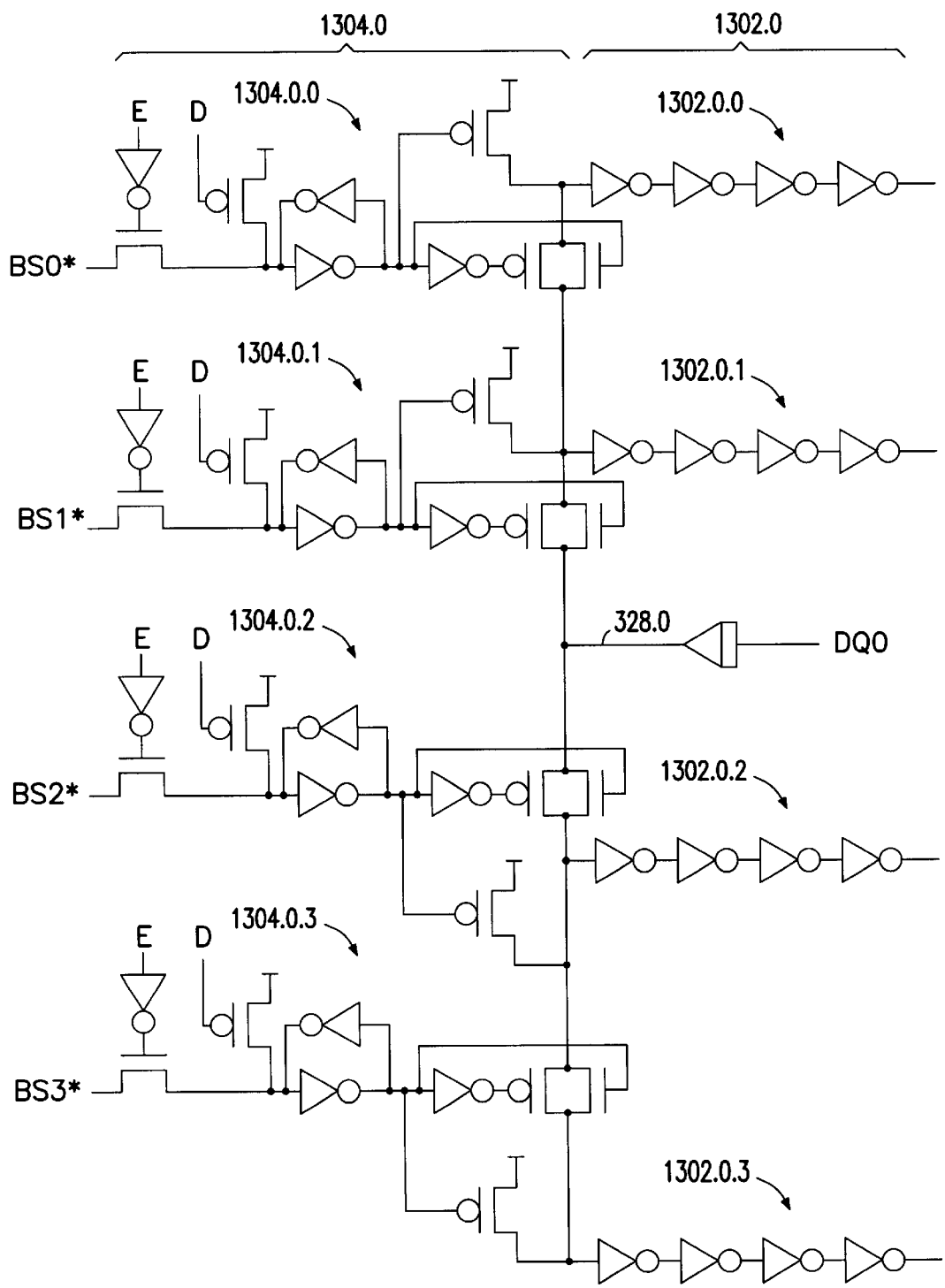
FIG. 13 shows a schematic diagram of a driver enable block and a driver block of FIG. 11 according to an embodiment of the invention.

FIG. 13 shows a schematic diagram of a driver enable block and a driver block of FIG. 11 according to an embodiment of the invention. Driver enable block 1304.0 and driver block 1302.0 represent driver enable block 304.0 and driver block 302.0 of FIG. 11. Driver enable block 1304.0 includes a plurality of driver enable circuits 1304.0.0 through 1304.0.3, corresponding to driver enable circuits 304.0.0–304.0.3 (FIG. 11). Driver block 1302.0 includes a plurality of drivers 1302.0.0 through 1302.0.3, corresponding to driver enable circuits 302.0.0–302.0.3 (FIG. 11).

Each driver enable circuit and its corresponding driver is similar to driver enable circuit 804 and driver 802 (FIG. 8) and have similar elements. For clarity, reference numbers of these similar elements are not shown in FIG. 13. The DQ0 signal and the BS0*–BS3* signals correspond to the same signals shown in FIG. 11 and FIG. 12.

The operation of each driver enable circuits and its corresponding driver is similar to the operation of driver enable circuit 804 and driver 802 (FIG. 8). For example, the operation of driver enable circuit 1304.0.0 and driver 1302.0.0 is similar to the operation of driver enable circuit 804 and driver 802 (FIG. 8).

In FIG. 13, one or more bank select signals of the BS0*–BS3* signals activate one or more driver enable circuits to allow the DQ0 signal to pass to a selected memory bank via an input path that includes one or more driver enable circuits and one or more drivers. For example, when bank 1 is selected, the BS1* signal activates driver enable circuit 1304.0.1. The DQ0 signal passes to bank 1 via an input path that includes driver enable circuit 1304.0.1. and driver 1302.0 1. As another example, when bank 0 is selected, the BS1* and BS0* signals are activated to activate driver enable circuits 1304.0.1 and 1304.0.0. The DQ0 signal passes to bank 0 via an input path that includes driver enable circuits .1304.0.1 and 1304.0.0 and driver 1302.0.0. Because driver enable circuit 1304.0.1 is activated, the DQ0 also passes to bank 1 via driver enable circuits 1304.0.1 and driver 1302.0.1. However, only the selected bank 0 writes the data represented by the DQ0 signal. The non-selected bank 1 ignores the data.

Figure 14:
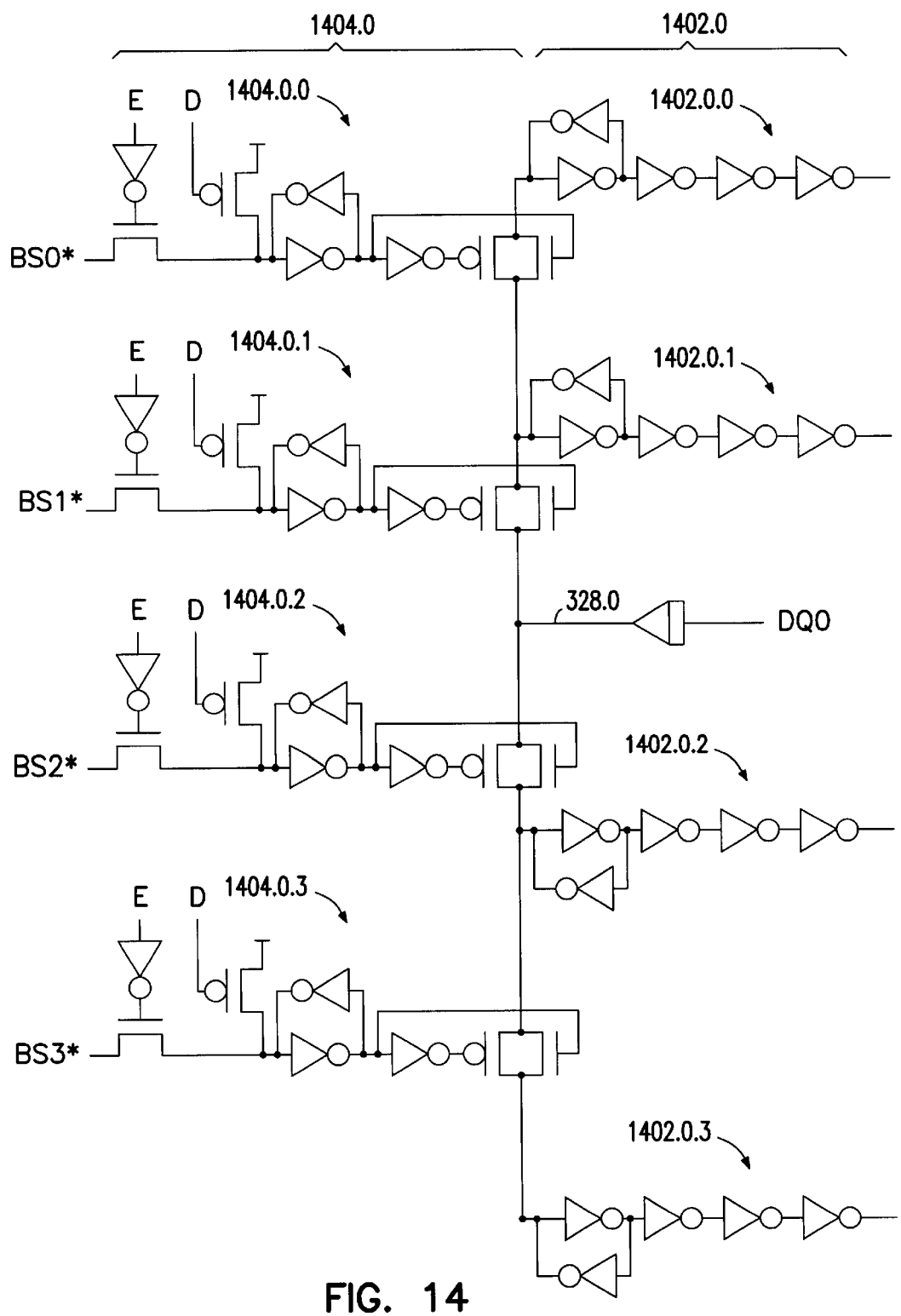
FIG. 14 shows a schematic diagram of a driver enable block and a driver block of FIG. 11 according to another embodiment of the invention.

FIG. 14 shows a schematic diagram of a driver enable block and a driver block of FIG. 11 according to another embodiment of the invention. Driver enable block 1404.0 and driver block 1402.0 represent driver enable block 304.0 and driver block 302.0 of FIG. 11. Driver enable block 1404.0 includes a plurality of driver enable circuits 1404.0.0 through 1404.0.3 corresponding to driver enable circuits 304.0.0–304.0.3 (FIG. 11). Driver block 1402.0 includes a plurality of drivers 1402.0.0 through 1402.0.3 corresponding to driver enable circuits 302.0.0–302.0.3 (FIG. 11).

Each of the driver enable circuits and its corresponding driver is similar to driver enable circuit 1004 and driver 1002 (FIG. 10) and have similar elements. For clarity, reference numbers of these similar elements are not shown in FIG. 14. The DQ0 signal and the BS0*–BS3* signals correspond to the same signals shown in FIG. 11 and FIG. 12.

The operation of each driver enable circuit and its corresponding driver is similar to the operation of driver enable circuit 1004 and driver 1002 (FIG. 10). For example, the operation of driver enable circuit 1404.0.0 and driver 1402.0.0 is similar to the operation of driver enable circuit 1004 and driver 1002 (FIG. 10).

Figure 15:
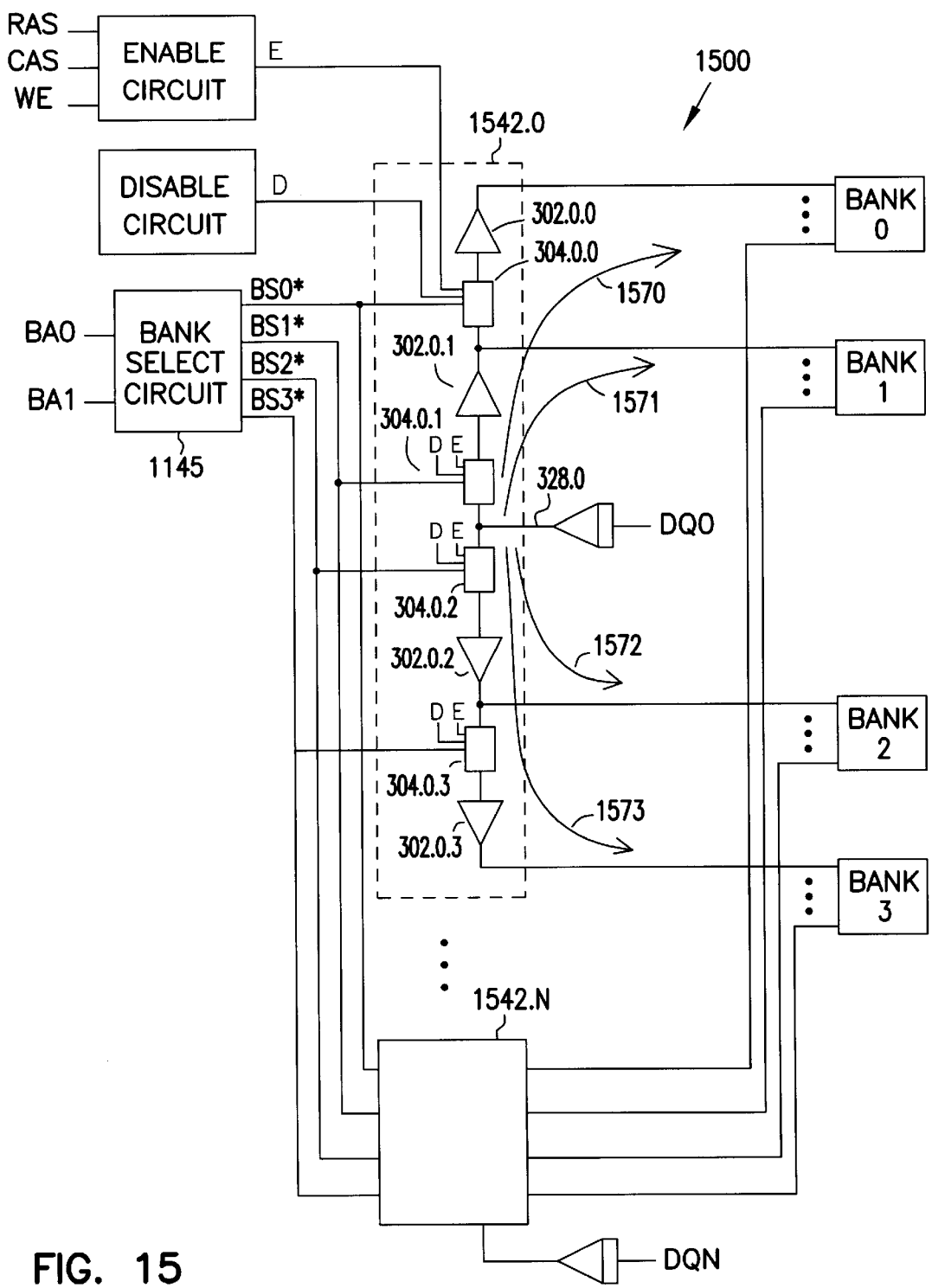
FIG. 15 shows a portion of a memory device according to another embodiment of the invention.

FIG. 15 shows a portion of a memory device according to another embodiment of the invention. Portion 1500 represents a portion of memory device 100 (FIG. 1) and represents embodiments of portion 200 (FIG. 2). Portion 1500 includes elements similar to elements of portion 1100 (FIG. 11). Elements that are similar in FIG. 11 and FIG. 15 have the same reference numbers. For clarity, some reference numbers from FIG. 11 are omitted in FIG. 15.

In FIG. 15, the driver enable circuits and the corresponding drivers connect in series with each other and form a driver enable and driver block. For example, driver enable circuits 304.0.0–304.0.3 and drivers 302.0.0–302.0.3 form a driver enable and driver block 1542.0. Other driver enable circuits and the corresponding drivers form other driver enable and driver blocks, for example, driver enable and driver block 1542.N.

Driver enable and driver block 1542.0 corresponds to a combination of driver enable block 304.0 and driver block 302.0 (FIG. 11). Driver enable and driver block 1542.N corresponds to a combination of driver enable block 304.N and driver block 302.N of (FIG. 11).

Portion 1500 includes subsets of drivers and subsets of driver enable circuits similar to that of portion 1100 (FIG. 11), in which each subset of drivers includes one or more drivers and each subset of driver enable circuits includes one or more driver enable circuits.

Driver enable circuits 304.0.0–304.0.3 and the drivers 302.0.0–302.0.3 form a plurality of input paths 1570, 1571, 1572, and 1573, each connecting between internal node 328.0 and a corresponding memory bank. Internal node 328.0 is common to all of input paths 1570–1573. Each input path includes one or more driver enable circuits and one or more drivers.

Each driver enable circuit and each driver represented by FIG. 15 can include embodiments of a driver enable circuit and driver represented by FIG. 8 or FIG. 10. For example, driver enable circuit 304.0.0 and driver 302.0.0 can include embodiments of driver enable circuit 804 and driver 802 (FIG. 8) or driver enable circuit 1004 and driver 1002 (FIG. 10).

The operation of portion 1500 is similar to the operation of portion 1100 (FIG. 11). Each input signal passes to a selected memory bank via one or more paths. Bank select circuit 1145 activates one or more bank select signals of the BS0*–BS3* signals to activate one or more driver enable circuits to allow the input signal to pass to a selected memory bank via an input path that includes one or more driver enable circuits and one or more drivers. For example, when bank 0 is selected, bank select circuit 1145 activates the BS1* and BS0* signals to activate driver enable circuits 304.0.1 and 304.0.0 to allow the DQ0 signal to pass through driver enable circuits 304.0.1 and 304.0.0 and drivers 302.0.1 and 302.0.0 to bank 0. In this case, the DQ0 signal passes to bank 0 via input path 1570. Because driver enable circuit 302.0.1 is activated, the DQ0 signal also passes to bank 1 via input path 1571. However, only the selected bank 0 writes the data represented by the DQ0 signal. The non-selected bank 1 ignores the data.

As another example, when bank 1 is selected, bank select circuit 1145 activates only the BS1* signal to activate driver enable circuit 304.0.1 to allow the DQ0 signal to pass to bank 1 through driver enable circuit 304.0.1 and driver 302.0.1. In this example, the DQ0 signal passes to the selected memory bank via only one input path and only one driver is activated.

Figure 16:
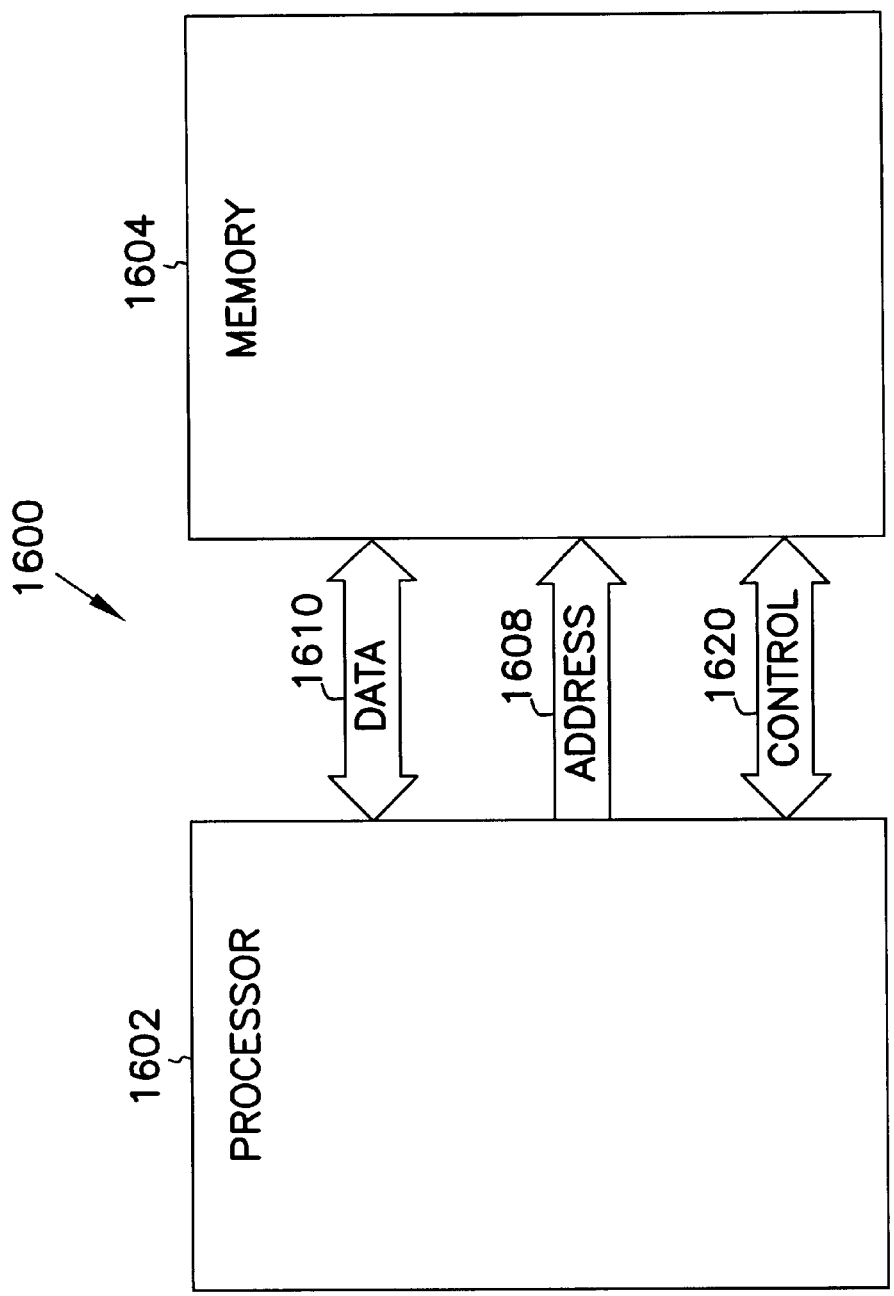
FIG. 16 shows a system according to an embodiment of the invention.

FIG. 16 shows a system 1600 according to one embodiment of the invention. System 1600 includes a first integrated circuit (IC) 1602 and a second IC 1604. ICs 1602 and 1604 can include processors, controllers, memory devices, application specific integrated circuits, and other types of integrated circuits. In FIG. 16, for example, IC 1602 represents a processor, and IC 1604 represents a memory device. Processor 1602 and memory device 1604 communicate using address signals on lines 1608, data signals on lines 1610, and control signals on lines 1620.

Memory device 1604 can be memory device 100 of FIG. 1. In some embodiments memory device 1604 includes a portion of a memory device such as portions 200, 300, 1100, and 1500.

System 1600 represented by FIG. 16 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

What is claimed is:

1. A memory device comprising:

a plurality of memory banks;

a plurality of drivers, each connecting to a corresponding one of the memory banks; and a plurality of driver enable circuits connected to the drivers for activating a subset of the drivers to pass a signal to be written into the memory banks, wherein the subset of the drivers includes a number of drivers that is less than a total number of the drivers.

2. The memory device of claim 1, wherein the subset of the drivers includes only one driver.

3. The memory device of claim 1, wherein each of the drivers includes a plurality of inverters connected in series between one of the driver enable circuits and the corresponding memory bank.

4. The memory device of claim 3, wherein the each of the drivers further includes a latch connected to the inverters.

5. The memory device of claim 1, wherein each of the driver enable circuits includes:

a pass gate connected between an internal node and a corresponding driver;

a latch connected to the pass gate; and a driver enable control unit for controlling the latch to turn on the pass gate to activate the corresponding driver.

6. The memory device of claim 5, wherein each of the driver enable circuits further includes a driver reset device connected to the corresponding driver to reset the driver.

7. The memory device of claim 5, wherein the driver enable control unit includes:

a switch connected between a select input node and the latch to set the latch to one state in response to an enable signal; and a latch reset device connected to the latch to reset the latch to another state in response to a disable signal.

8. A memory device comprising:

a plurality of memory banks; and a plurality of input paths, each connecting between a corresponding one of the memory banks and an internal node common to the input paths, the input paths including a plurality of driver enable circuits and a plurality of drivers to drive an input signal to be written into one of the memory banks to the memory banks via a subset of the input paths, wherein the subset of the input paths includes fewer drivers than a total number of the drivers.

9. The memory device of claim 8, wherein the driver enable circuit includes:

a pass gate connected between the internal node and the driver;

a latch connected to the pass gate; and a driver enable control unit connected to the latch.

10. The memory device of claim 9, wherein the driver enable control unit includes:

a pass transistor connected between an input node of the latch and a select input node of the driver enable circuit; and a latch reset transistor connected between the input of the latch and a supply node.

11. The memory device of claim 10, wherein the driver includes a plurality of inverters connected in series between the driver enable circuit and the corresponding memory bank.

12. The memory device of claim 11, wherein the driver further includes a latch connected to the inverters.

13. The memory device of claim 8, wherein the subset of the input paths includes one half number of the input paths.

14. The memory device of claim 8, wherein the subset of the input paths includes only one path connected between the internal node and the selected memory bank.

15. A memory device comprising:

a plurality of memory banks;

a plurality of bank input nodes to receive a plurality of bank address signals for selecting one of the memory banks as a selected memory bank;

a plurality of drivers, each connecting to one of the memory banks; and a plurality of driver enable circuits, each connecting between a corresponding one of the drivers and an internal node common to the driver enable circuits for passing an input signal to be written into the selected memory bank from the internal node to only the corresponding driver that connects to the selected memory bank, wherein each of the driver enable circuits includes a pass gate connected between the internal node and the corresponding driver.

16. The memory device of claim 15, wherein each of the driver enable circuits further includes:

a latch connected to the pass gate; and a driver enable control unit connected to the latch.

17. The memory device of claim 15, wherein the driver enable control unit includes:

a pass transistor connected between an input node of the latch and a select input node of the driver enable circuit; and a latch reset transistor connected between the input of the latch and a supply node.

18. The memory device of claim 15, wherein each of the drivers includes a plurality of inverters connected in series between one of the driver enable circuits and one of the memory banks.

19. The memory device of claim 18, wherein each of the driver enable circuits further includes a driver reset device connected to the corresponding driver to reset the driver.

20. The memory device of claim 18, wherein each of the drivers further includes a latch connected to the inverters.

21. A memory device comprising:

a plurality of memory banks;

one or more bank input nodes to receive one or more bank address signals for selecting one of the memory banks as a selected memory bank;

a plurality of drivers, each connecting to a corresponding one of the memory banks; and a plurality of driver enable circuits connected to the drivers for passing an input signal to be written into the selected memory bank to the one driver that connects to the selected memory bank and for passing the input signal to one or more other drivers but not all of the drivers, wherein each of the driver enable circuits includes a pass gate connected to a corresponding driver.

22. The memory device of claim 21, wherein each of the driver enable circuits further includes:

a latch connected to the pass gate; and a driver enable control unit connected to the latch.

23. The memory device of claim 22, wherein the driver enable control unit includes:

a pass transistor connected to an input node of the latch; and a latch reset transistor connected to the input of the latch.

24. The memory device of claim 23, wherein each of the driver enable circuits further includes a driver reset device connected to the corresponding driver to reset the driver.

25. The memory device of claim 21, wherein each of the drivers includes a plurality of inverters connected in series between one of the driver enable circuits and one of the memory banks.

26. The memory device of claim 25, wherein each of the drivers further includes a latch connected to the inverters.

27. A system comprising:

a processor; and a memory device connected to the processor, the memory device including:

a plurality of memory banks;

a plurality of drivers, each connecting to a corresponding one of the memory banks; and a plurality of driver enable circuits connected to the drivers for activating a subset of the drivers to pass a signal to be written into one of the memory banks to the memory banks, wherein the subset of the drivers includes a number of drivers that is less than a total number of the drivers.

28. The system of claim 27, wherein each of the driver enable circuits includes:

a pass gate connected between an internal node and a corresponding driver;

a latch connected to the pass gate; and a driver enable control unit for controlling the latch to turn on the pass gate to activate the corresponding driver.

29. The system of claim 28, wherein the driver enable control unit includes:

a switch connected between a select input node and the latch to set the latch to one state in response to an enable signal; and a latch reset device connected to the latch to reset the latch to another state in response to a disable signal.

30. The system of claim 29, wherein each of the driver enable circuits further includes a driver reset device connected to the corresponding driver to reset the driver.

31. The system of claim 29, wherein each of the drivers includes a plurality of inverters connected in series between one of the driver enable circuits and the corresponding memory bank.

32. The system of claim 31, wherein each of the drivers further include a latch connected to the inverters.

33. A system comprising:

a processor; and a memory device connected to the processor, the memory device including:
 a plurality of memory banks; and
 a plurality input paths, each connecting between a corresponding one of the memory banks and an internal node common to the input paths, the input paths including a plurality of driver enable circuits a plurality of drivers to drive an input signal to be written into one of the memory banks to the memory banks via a subset of the input paths, wherein the subset of the input paths includes fewer drivers than a total number of the drivers.

34. The system of claim 33, wherein the driver includes a plurality of inverters connected in series between the driver enable circuit and the corresponding memory bank.

35. The system of claim 34, wherein the driver enable circuit includes:

a pass gate connected between the internal node and the driver;

a latch connected to the pass gate; and a driver enable control unit connected to the latch.

36. The system of claim 35, wherein each of the driver enable circuits further includes a driver reset device connected to a corresponding driver to reset the driver.

37. The system of claim 35, wherein the driver enable control unit includes:

a pass transistor connected between an input node of the latch and a select input node of the driver enable circuit; and a latch reset transistor connected between the input of the latch and a supply node.

38. The system of claim 37, wherein the driver further include a latch connected to the inverters.

39. A system comprising:

a processor; and a memory device connected to the processor, the memory device including:
 a plurality of memory banks;
 one or more bank input nodes to receive one or more bank address signals for selecting one of the memory banks as a selected memory bank;
 a plurality of drivers, each connecting to one of the memory banks; and
 a plurality of driver enable circuits, each connecting between a corresponding one of the drivers and an internal node common to the driver enable circuits for passing an input signal to be written into the selected memory bank from the internal node to only the corresponding driver that connects to the selected memory bank, wherein each of the driver enable circuits includes a pass gate connected between the internal node and the corresponding driver, wherein each of the drivers includes a plurality of inverters connected in series between one of the driver enable circuits and one of the memory banks.

40. A system comprising:

a processor; and a memory device connected to the processor, the memory device including:
 a plurality of memory banks;
 one or more bank input nodes to receive one or more bank address signals for selecting one of the memory banks as a selected memory bank;
 a plurality of drivers, each connecting to one of the memory banks; and
 a plurality of driver enable circuits, each connecting between a corresponding one of the drivers and an internal node common to the driver enable circuits for passing an input signal to be written into the selected memory bank from the internal node to only the corresponding driver that connects to the selected memory bank, wherein each of the driver enable circuits includes a pass gate connected between the internal node and the corresponding driver.

41. The system of claim 40, wherein each of the driver enable circuits further includes:

a latch connected to the pass gate; and a driver enable control unit connected to the latch.

42. The system of claim 41, wherein the driver enable control unit includes:

a pass transistor connected between an input node of the latch and a select input node of the driver enable circuit; and a latch reset transistor connected between the input of the latch and a supply node.

43. A system comprising:

a processor; and a memory device connected to the processor, the memory device including:
 a plurality of memory banks;
 one or more bank input nodes to receive one or more bank address signals for selecting one of the memory banks as a selected memory bank;
 a plurality of drivers, each connecting to a corresponding one of the memory banks; and
 a plurality of driver enable circuits connected to the drivers for passing an input signal to be written into the selected memory bank to the one driver that connects to the selected memory bank and to one or more other drivers but not all the drivers, wherein each of the driver enable circuits includes a pass gate connected to a corresponding driver.

44. The system of claim 43, wherein each of the drivers includes a plurality of inverters connected in series between one of the driver enable circuits and one of the memory banks.

45. A method of driving a signal, the method comprising:

selecting a selected memory bank among a plurality of memory banks;

passing an input signal to be written into the selected memory bank to an internal node common to a plurality of input paths connected to the memory banks, the input paths including a plurality of drivers; and passing the input signal from the internal node to the selected memory bank via a subset of the input paths, wherein the subset of the input paths includes fewer drivers than the total number of the drivers.

46. The method of claim 45, wherein selecting among a plurality of memory banks includes:

receiving a plurality of bank input signals; and activating a bank select signal based on a combination of the bank input signals.

47. The method of claim 46, wherein passing the input signal includes:

activating a pass gate connected to the internal node based on the bank select signal; and passing the input signal from the internal node through the pass gate.

48. The method of claim 47, wherein activating a pass gate occurs during an active mode of a memory device.

49. The method of claim 46, wherein passing an input signal occurs during the write mode of a memory device.

50. A method of driving a signal, the method comprising:

selecting a selected memory bank among a plurality of memory banks;

passing an input signal to be written into the selected memory bank to a plurality of driver enable circuits connected to a plurality of drivers;

activating a subset of the driver enable circuits, wherein the subset of the driver enable circuits includes a number of driver enable circuits that is less than a total number of the driver enable circuits;

passing the input signal from the subset of the driver enable circuits to a subset of the drivers, wherein the subset of the drivers includes a number of drivers that is less than a total number of the drivers; and driving the input signal from the subset of the drivers to the selected memory bank.

51. The method of claim 50, wherein activating a subset includes:

activating an enable signal to turn on a pass transistor;

passing a bank select signal through the pass transistor; and turning on a pass gate in response to the bank select signal.

52. The method of claim 51, wherein passing the input signal from the internal node includes passing the input signal from one terminal of a pass gate that connects to the internal node to another terminal of the pass gate that connects to a corresponding driver.

53. The method of claim 52, wherein turning on a pass gate occurs during an active mode of a memory device.

54. The method of claim 53, wherein driving the input signal occurs during a write mode of a memory device.

* * * * *

UNITED STATES PATENT AND TRADEMARK OFFICE
CERTIFICATE OF CORRECTION

PATENT NO.     : 6,687,180 B2
DATED          : February 3, 2004
INVENTOR(S)    : Drexler et al.

It is certified that error appears in the above-identified patent and that said Letters Patent is hereby corrected as shown below:

Column 1,
Line 21, delete "th" and insert -- the --, therefor.
Line 27, after "memory" delete ",".

Column 3,
Line 3, after "memory" delete ",".
Line 13, delete "barks" and insert -- banks --, therefor.
Line 26, after "active" delete ",".
Line 61, insert -- node -- before "to output".

Column 4,
Line 25, delete "202.0.M;" and insert -- 202.0.M, --, therefor.
Line 44, delete "is" and insert -- are --, therefor.
Line 61, delete "formal" and insert -- form a --, therefor.

Column 6,
Line 42, delete "302.0.0-302.0.3.form" and insert -- 302.0.0-302.0.3 form --, therefor.

Column 7,
Line 2, delete "are" and insert -- is --, therefor.
Line 16, delete "450453" and insert -- 450-453 --, therefor.
Line 50, delete ":" and insert -- . --, therefor.

Column 9,
Line 62, delete "The" and insert -- the --, therefor.

Column 10,
Line 54, delete "interrial" and insert -- internal --, therefor.

Column 12,
Line 5, delete "FIG. 2." and insert -- FIG. 12. --, therefor.
Line 10, delete "bank,select" and insert -- bank select --, therefor.
Line 47, delete "1304.0.1." and insert -- 1304.0.1 --, therefor.
Line 48, delete "1302.0 1" and insert -- 1302.0.1 --, therefor.
Line 52, delete "." before "1304.0.1".

UNITED STATES PATENT AND TRADEMARK OFFICE
CERTIFICATE OF CORRECTION

PATENT NO. : 6,687,180 B2
DATED : February 3, 2004
INVENTOR(S) : Drexier et al.

It is certified that error appears in the above-identified patent and that said Letters Patent is hereby corrected as shown below:

<u>Column 17,</u>
Line 21, after "plurality" insert -- of --.
Line 24, after "circuits" insert -- , --.

Signed and Sealed this

Eleventh Day of May, 2004

JON W. DUDAS
*Acting Director of the United States Patent and Trademark Office*